(12) United States Patent
Otsuka

(10) Patent No.: US 7,250,679 B2
(45) Date of Patent: Jul. 31, 2007

(54) SEMICONDUCTOR DEVICE AND METHOD FOR FABRICATING THE SAME

(75) Inventor: Satoshi Otsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/816,955

(22) Filed: Apr. 5, 2004

(65) Prior Publication Data

US 2005/0093160 A1    May 5, 2005

(30) Foreign Application Priority Data

Oct. 31, 2003   (JP)   ............................. 2003-372304

(51) Int. Cl.
*H01L 23/48* (2006.01)
*H01L 23/52* (2006.01)
*H01L 29/40* (2006.01)

(52) U.S. Cl. ...................... 257/751; 257/761; 257/773; 257/774; 257/775; 257/759; 257/760

(58) Field of Classification Search ........ 257/773–775, 257/759–760, 751, 762
See application file for complete search history.

(56) References Cited

U.S. PATENT DOCUMENTS 5,739,579 A * 4/1998 Chiang et al. .............. 257/635
6,373,136 B2    4/2002 Otsuka et al.
6,573,604 B1 * 6/2003 Kajita ......................... 257/758
6,670,714 B1 * 12/2003 Miyamoto et al. .......... 257/758
6,680,540 B2 * 1/2004 Nakano et al. ............. 257/758
2004/0104481 A1 * 6/2004 Ong ............................ 257/758

FOREIGN PATENT DOCUMENTS

JP    2001-298084    10/2001

* cited by examiner

*Primary Examiner*—Sara Crane
*Assistant Examiner*—Samuel A. Gebremariam
(74) *Attorney, Agent, or Firm*—Westerman, Hattori, Daniels & Adrian, LLP.

(57) ABSTRACT

The semiconductor device comprises a lower interconnection part 12 which is formed on a silicon substrate 10 and includes an inter-layer insulation film 36 formed of a low-k film 32 and a hydrophilic insulation film 34 formed on the low-k film 32, and an interconnection layer 44a, 44b buried in interconnection trenches 38a, 38b formed in the inter-layer insulation film 36 and having an interconnection pitch which is a first pitch; and an intermediate interconnection part 14 which is formed on the lower interconnection part 12 and includes an inter-layer insulation film 142 formed of low-k films 136, 140, an interconnection layer 152a, 152b buried in interconnection trenches 146a, 146b formed in the inter-layer insulation film 142 and having an interconnection pitch which is a second pitch larger than the first pitch, and an SiC film 154 formed directly on the low-k film 140 and the interconnection layer 152a, 152b.

15 Claims, 17 Drawing Sheets

SEMICONDUCTOR DEVICE AND METHOD FOR FABRICATING THE SAME

CROSS-REFERENCE TO RELATED APPLICATION

This application is based upon and claims priority of Japanese Patent Application No. 2003-372304, filed on Oct. 31, 2003, the contents being incorporated herein by reference.

BACKGROUND OF THE INVENTION

The present invention relates to a semiconductor device having a multilayer interconnection structure and a method for fabricating the semiconductor device, more specifically a semiconductor device having a multilayer interconnection structure using low dielectric constant (low-k) films as the inter-layer insulation films and a method for fabricating the semiconductor device.

The recent increasing micronization of semiconductor devices requires decrease of the interconnection resistance and interconnection capacitance of the semiconductor devices.

To meet such requirement, the main material of the interconnections is shifting from Al (aluminum) to Cu (copper) having lower relative resistance and better electromigration characteristics. Accompanying the shift of the major material of the interconnections to Cu, the process for forming the interconnections is shifting from the processing of depositing the interconnection materials and patterning them by lithography and dry etching as of RIE (Reactive Ion Etching) or others to the so-called damascene process (refer to, e.g., Japanese Patent Application Unexamined Publication No. 2001-298084). In the damascene process, trench patterns and hole patterns are formed in the interconnection insulation films, and the interconnection material is buried in the trenches and holes. The shift of the forming process to the damascene process accompanying the shift of the interconnection material to Cu is because Cu is difficult to process by RIE, while Al is not.

As the materials of the inter-layer insulation films for the insulation between the interconnections, $SiO_2$, FSG (fluorinated silicate glass), etc. have been so far used.

As a countermeasure to the interconnection delay due to the recent micronization, decrease of the interconnection resistance and interconnection capacitance is required. However, it is difficult to further lower the resistance of the interconnections formed of Cu as the major material. It is being studied to use as the inter-layer insulation films low-k films whose dielectric constants are lower than silicon oxide film and silicon nitride film to thereby decrease the interconnection capacitance.

As semiconductor elements are increasingly micronized, a number of transistors to be mounted on a chip is on increase and is even 100M pieces. The interconnection layers interconnecting the transistors and supplying power sources are required to have various functions. That is, the source interconnections are required to be the interconnections of low resistance for making the voltage decreases small. The interconnections interconnecting short distances are required to be micronized interconnections for higher circuit densities. The interconnections interconnecting circuit blocks are required to have lower resistance than the micronized interconnections and have pitches whish are more micronized than the upper interconnection layers.

In the multilayer interconnection structure of semiconductor devices, in order to satisfy such various requirements of these interconnection layers, interconnection layer parts each formed of a plurality of layers and divided in functions, such as a lower layer interconnection which can define micronized pitches, an intermediate layer interconnection used as the interconnections among circuit blocks, and an upper layer interconnection used as source interconnections, clock interconnection, etc., are put together.

FIG. 17 is a sectional view of a semiconductor device having the conventional multilayer interconnection structure, which shows the structure thereof.

A device isolation film 302 for defining a device region is formed on a silicon substrate 300. A MOS transistor including a gate electrode 304 and source/drain diffused layers 306 is formed in the device region of the silicon substrate 300.

An inter-layer insulation film 310 with a contact plug 308 buried in is formed on the silicon substrate 300 with the MOS transistor formed on.

On the inter-layer insulation film 310 with the contact plug 308 buried in, an inter-layer insulation film 312 is formed of a silicon nitride film and one of a silicon oxide film or an FSG film laid on the silicon nitride film. In the region of the inter-layer insulation film 312, which includes the contact plug 308, an interconnection layer 314a of a barrier metal layer of a Ta (tantalum) film and a Cu (copper) film is buried, connected to the contact plug 308. An interconnection layer 314b of the barrier metal layer of the tantalum film and the Cu film is buried in the other region of the inter-layer insulation film 312.

On the inter-layer insulation film 312 with the interconnection layers 314a, 314b buried in, an inter-layer insulation film 316 is formed of a silicon nitride film and one of a silicon oxide film or an FSG film laid on the silicon nitride film. An inter-layer insulation film 318 is formed of a silicon nitride film and one of a silicon oxide film or an FSG film laid on the silicon nitride film. In the regions of the inter-layer insulation films 316, 318 on the interconnection layer 314a, an interconnection layer 320a of a barrier metal layer of a tantalum film, and a Cu film is buried, connected to the interconnection layer 314a with the via portion buried in the inter-layer insulation film 316 and with the interconnection portion buried in the inter-layer insulation film 318. In the region of the inter-layer insulation film 318 over the interconnection layer 314b, an interconnection layer 320b of a barrier metal layer of a tantalum film, and a Cu film is buried.

On the interconnection layer 318 with the interconnection layers 320a, 320b buried in, an inter-layer insulation film 322 is formed of a silicon nitride film and one of a silicon oxide film or an FSG film laid on the silicon nitride film. On the inter-layer insulation film 322, an inter-layer insulation film 324 is formed of a silicon nitride film and one of a silicon oxide film or an FSG film laid on the silicon nitride film. In the regions of the inter-layer insulation films 322, 324 on the interconnection layer 320a, an interconnection layer 326a of a barrier metal layer of a tantalum film, and a Cu film is buried, connected to the interconnection layer 320a with the via portion buried in the inter-layer insulation film 322 and with the interconnection portion buried in the inter-layer insulation film 324. In the region of the inter-layer insulation film 324 over the connection layer 320b, an interconnection layer 326b of a barrier metal layer of a tantalum film, and a Cu film is buried.

On the interconnection layer 324 with the interconnection layers 326a, 326b buried in, an inter-layer insulation film 328 is formed of a silicon nitride film and one of a silicon oxide film or an FSG film laid on the silicon nitride film. On the inter-layer insulation film 328, an inter-layer insulation film 330 is formed of a silicon nitride film and one of a silicon oxide film or an FSG film laid on the silicon nitride film. In the regions of the inter-layer insulation films 328, 330 on the interconnection layer 326a, an interconnection layer 332a of a barrier metal layer of a tantalum film, and a Cu film is buried, connected to the interconnection layer 326a with the via portion buried in the inter-layer insulation film 328 and with the interconnection portion buried in the inter-layer insulation film 330. In the region of the inter-layer insulation film 330 over the connection layer 326b, an interconnection layer 332b of a barrier metal layer of a tantalum film, and a Cu film is buried.

Thus, the lower interconnection part having the four-layer multilayer interconnection structure of the interconnection layers 314a, 314b, the interconnection layers 320a, 320b, the interconnection layers 326a, 326b and the interconnection layers 332a, 332b is formed on the silicon substrate 300.

On the interconnection layer 330 with the interconnection layers 332a, 332b buried in, an inter-layer insulation film 334 is formed of a silicon nitride film and one of a silicon oxide film or an FSG film laid on the silicon nitride film. On the inter-layer insulation film 334, an inter-layer insulation film 336 is formed of a silicon nitride film and one of a silicon oxide film or an FSG film laid on the silicon nitride film. In the regions of the inter-layer insulation films 334, 336 on the interconnection layer 332a, an interconnection layer 338a of a barrier metal layer of a tantalum film, and a Cu film is buried, connected to the interconnection layer 332a with the via portion buried in the inter-layer insulation film 334 and with the interconnection portion buried in the inter-layer insulation film 336. In the region of the inter-layer insulation film 336 over the connection layer 332b, an interconnection layer 338b of a barrier metal layer of a tantalum film, and a Cu film is buried.

On the interlayer insulation film 336 with the interconnection layers 338a, 338b buried in, an inter-layer insulation film 340 is formed of a silicon nitride film and one of a silicon oxide film or an FSG film laid on the silicon nitride film. On the inter-layer insulation film 340, an inter-layer insulation film 342 is formed of a silicon oxide film and one of a silicon oxide film or an FSG film laid on the silicon nitride film. In the regions of the inter-layer insulation films 340, 342 on the interconnection layer 338a, an interconnection layer 344a of a barrier metal layer of a tantalum film, and a Cu film is buried, connected to the interconnection layer 338a with the via portion buried in the inter-layer insulation film 340 and with the interconnection portion buried in the inter-layer insulation film 342. In the region of the inter-layer insulation film 342 over the connection layer 338b, an interconnection layer 344b of a barrier metal layer of a tantalum film, and a Cu film is buried.

Thus, the upper interconnection part having the two-layer multilayer interconnection structure of the interconnection layers 338a, 338b and the interconnection layers 344a, 344b having interconnection patterns of a larger pitch than the interconnection layers 314a, 314b, the interconnection layer 320a, 320b, the interconnection layer 326a, 326b and the interconnection layers 332a, 332b of the lower interconnection part is formed on the lower interconnection part.

On the inter-layer insulation film 342 with the interconnection layers 344a, 344b buried in, an inter-layer insulation film 346 is formed of a silicon oxide film laid on a silicon nitride film. Contact plugs 348 are buried in the inter-layer insulation film 346.

On the region of the inter-layer insulation film 346 containing the contact plugs 348, an electrode 350 is formed, connected to the interconnection layer 344a through the contact plugs 348.

On the inter-layer insulation film 346 with the electrode 350 formed on, a cover film 352 is formed of a silicon nitride film 352a formed on a silicon oxide film 352b. An opening 354 is formed in the cover film 352 down to the electrode 350.

In the case that the interconnection layers are divided in terms of functions as described above, the structures of the respective interconnection layers are changed in accordance with required characteristics.

For example, the lower layer interconnections are formed at small pitches, and to decrease the interconnection capacitance, film thicknesses of the interconnection layers are made small. In order to decrease the interconnection capacitance, materials of the inter-layer insulation films must be low-k materials.

On the other hand, the upper layer interconnections are formed at larger interconnection pitches so as to allow the interconnections to be formed in a thicker thickness. The interconnection capacitance does not critically matter in the upper interconnection layers, which permits silicon oxide film to be used as the inter-layer insulation films.

The intermediate layer interconnections are required to have characteristics which are middle between the lower layer interconnections and the upper layer interconnections described above. At this time, the intermediate layer interconnections, which interconnect the circuit blocks, have the interconnection length larger than the lower layer interconnections, and the resistance must be made low. Accordingly, the thickness of the interconnection is larger than the lower layer interconnections, and the pitch of the interconnections is larger. The interconnection capacitance increase due to the thick interconnections must be suppressed, and to this end, low-k materials must be used as the material of the inter-layer insulation films.

However, when low-k films are used as the inter-layer insulation films in place of silicon oxide film, etc. for the end of decreasing the interconnection capacitance in the lower layer interconnections and the intermediate layer interconnections, an inconvenience that defects easily take place in the interconnections, which lowers the yield, and others have happened.

SUMMARY OF THE INVENTION

An object of the present invention is to provide a semiconductor device using low-k films as the inter-layer insulation films of the multilayer interconnection structure, which can achieve the suppression of the defect occurrence and the decrease of the interconnection capacitance corresponding to the functions of the interconnections, and a method for fabricating the semiconductor device.

According to one aspect of the present invention, there is provided a semiconductor device comprising: a first inter-layer insulation film formed over a substrate and including a first low dielectric constant film and a hydrophilic insulation film formed on the first low dielectric constant film; a first interconnection layer buried in a first interconnection trench formed in the first inter-layer insulation film, whose minimum interconnection pitch is a first pitch; a second inter-layer insulation film formed over the first inter-layer insulation film and including a second low dielectric constant film; a second interconnection layer buried in a second interconnection trench formed in the second inter-layer insulation film, whose minimum interconnection pitch is a second pitch larger than the first pitch; and a diffusion preventing film formed directly on the second low dielectric constant film and the second interconnection layer.

According to another aspect of the present invention, there is provided a semiconductor device comprising: a first multilayer interconnection layer formed over a substrate and including a plurality of interconnection layers whose minimum interconnection pitch is a first pitch; and a second multilayer interconnection layer formed over the first multilayer interconnection layer and including a plurality of interconnection layers whose minimum interconnection pitch is a second pitch larger than the first pitch, at least one of said plurality of interconnection layers forming the first multilayer interconnection layer being buried in an opening formed in a first inter-layer insulation film including a first low dielectric constant film and a hydrophilic insulation film formed on the first low dielectric constant film, the respective plurality of interconnection layers forming the second multilayer interconnection layer being buried in an opening formed in a second inter-layer insulation film including a diffusion preventing film and a second low dielectric constant film formed on the diffusion preventing film, and the diffusion preventing film of one second inter-layer insulation film being formed directly on the second low dielectric constant film of another second inter-layer insulation film underlying said one second inter-layer insulation film.

According to further another aspect of the present invention, there is provided a method for fabricating a semiconductor device comprising the steps of: forming over a substrate a first inter-layer insulation film including a first low dielectric constant film and a first hydrophilic insulation film formed on the first low dielectric constant film; forming a first interconnection trench in the first inter-layer insulation film; forming a first conductor film on the first inter-layer insulation film with the first interconnection trench formed in; polishing the first conductor film to expose the first hydrophilic insulation film while burying the first conductor film in the first interconnection trench to form a first interconnection layer whose minimum interconnection pitch is a first pitch; forming a second inter-layer insulation film including a second low dielectric constant film over the first inter-layer insulation film; forming a second interconnection trench in the second inter-layer insulation film; forming a second conductor film on the second inter-layer insulation film with the second interconnection trench formed in; and polishing the second conductor film to expose the second low dielectric constant film while burying the second conductor film in the second interconnection trench to form a second interconnection layer whose minimum interconnection pitch is a second pitch larger than the first pitch.

As described above, the semiconductor device according to the present invention comprises: a first inter-layer insulation film formed over a substrate and including a first low dielectric constant film and a hydrophilic insulation film formed on the first low dielectric constant film; a first interconnection layer buried in a first interconnection trench formed in the first inter-layer insulation film, whose minimum interconnection pitch is a first pitch; a second inter-layer insulation film formed over the first inter-layer insulation film and including a second low dielectric constant film; a second interconnection layer buried in a second interconnection trench formed in the second inter-layer insulation film, whose minimum interconnection pitch is a second pitch larger than the first pitch; and a diffusion preventing film formed directly on the second low dielectric constant film and the second interconnection layer, whereby in a case that low dielectric constant films are used as the inter-layer insulation films of a multilayer interconnection structure, corresponding to functions of the interconnections, the first interconnection layer can suppress the occurrence of defects and the decreases the interconnection capacitance, while the second interconnection layer can sufficiently decrease the interconnection capacitance.

DETAILED DESCRIPTION OF THE INVENTION

In order to decrease the interconnection capacitance of semiconductor devices, as described above, the use of low-k materials as materials of the inter-layer insulation films is being studies. As the low-k materials are known SiOC, SiLK (registered trademark) by The Dow Chemical Company, FLARE (registered trademark) by Honeywell Electronic Materials, etc. Most of such low-k materials are water-repellent. This is for the following reason. The relative dielectric constant of water is as high as 88. Accordingly, when a film formed of a low-k material absorbs humidity, the dielectric constant of the film rises. To suppress the dielectric constant increase due to the humidity absorption, the low-k materials are terminated with Si—H, SiCH$_3$ for the processing for prohibiting the formation of Si—OH bonds, which are hydrophilic.

As mentioned above, in order to suppress the dielectric constant increase due to the humidity absorption, the low-k materials are terminated with hydrogen, methyl or others to be water-repellent. Earnest studies by the inventor of the present invention have made it clear that, as will be described below, in cases that the materials of the inter-layer insulation films of the interconnection layers are low-k materials, it is one of causes for the yield decrease that the low-k materials are made water-repellent.

The lower interconnections for short-distant interconnections, which are formed at small pitches, are more vulnerable to defects due to foreign matter adhering thereto. Accordingly, it is necessary to lift off the foreign matter by HF (hydrofluoric acid) processing added to the cleaning following the CMP (chemical mechanical polishing) of the damascene process. However, when the wafer surface is made water-repellent by using low-k films made water-repellent as the inter-layer insulation film materials, even the HF processing finds it difficult to remove the foreign matter by the lift-off.

Figure 1:
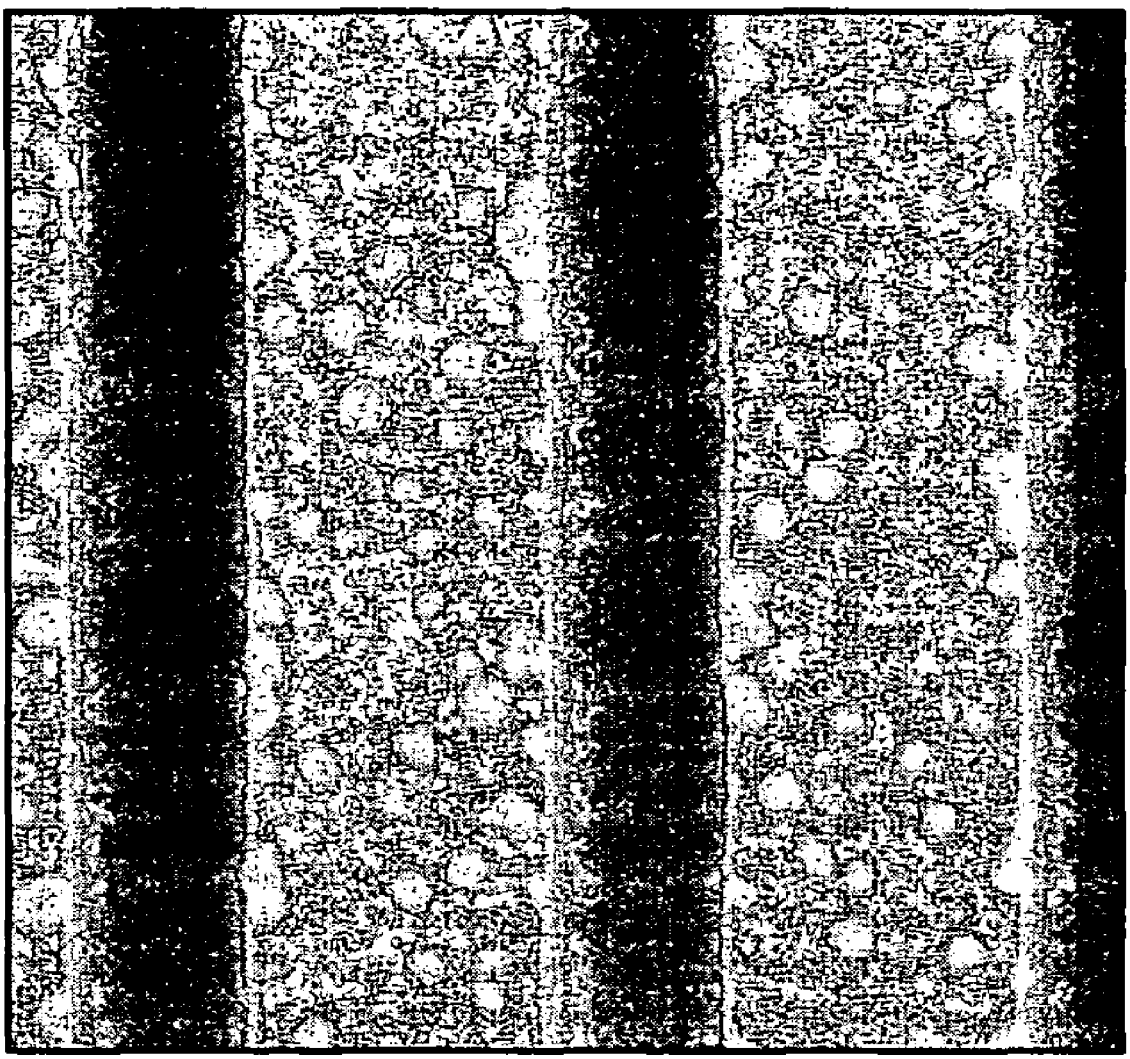
FIG. 1 is an SEM picture showing corrosion of interconnections due to water marks.

In addition, when the wafer surface is made water-repellent by the water-repellent low-k films, water marks of water drops remaining after the cleaning and drying tend to take place. Such water marks corrode the interconnections to resultantly cause defects. This is a cause of the yield decrease. FIG. 1 is an SEM (Scanning Electron Microscope) picture showing the corrosion of the interconnection due to the water marks.

The semiconductor device and the method for fabricating the same according to the present invention suppresses the occurrence of the defects, and realizes the interconnection capacitance decrease, corresponding to the functions of the interconnection layers of a multilayer interconnection structure even when the inter-layer insulation films are formed of such water-repellent low-k films.

Figure 2:
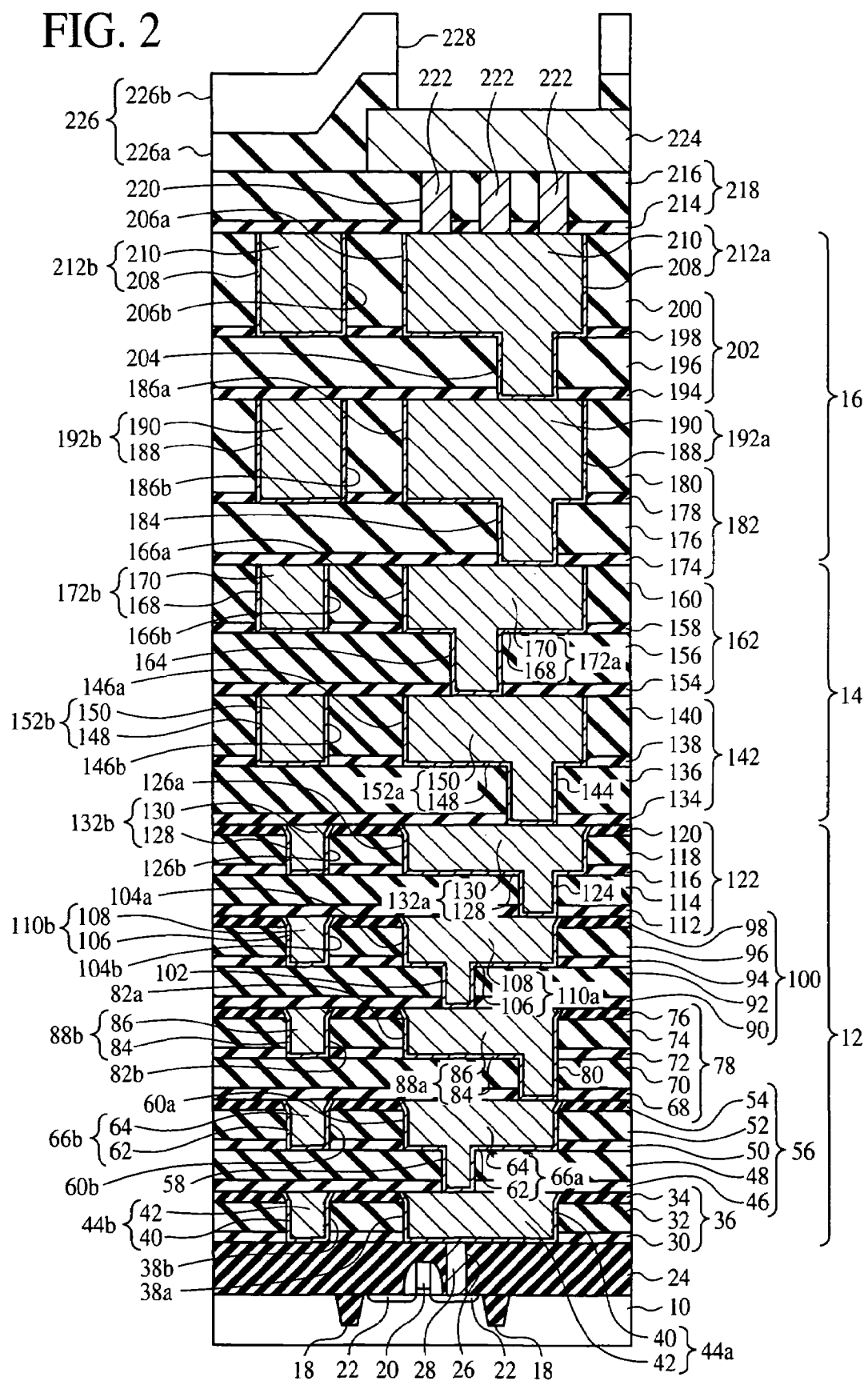
FIG. 2 is a sectional view of the semiconductor device according to one embodiment of the present invention, which shows a structure thereof.

The semiconductor device and the method for fabricating the same according to one embodiment of the present invention will be explained with reference to FIGS. 2, 3A–3E, 4A–4D, 5A–5D, 6A–6C, 7A–7C, 8A–8B, 9A–9D, 10A–10D, 11A–11C, 12A–12D, 13A–13D, 14A–14C, 15A–15C, and 16A–16B. FIG. 2 is a sectional view of the semiconductor device according to the present embodiment, which shows a structure thereof. FIGS. 3A–3E, 4A–4D, 5A–5D, 6A–6C, 7A–7C, 8A–8B, 9A–9D, 10A–10D, 11A–11C, 12A–12D, 13A–13D, 14A–14C, 15A–15C, and 16A–16B are sectional views of the semiconductor device according to the present embodiment in the steps of the method for fabricating the semiconductor device, which show the method.

Then, the structure of the semiconductor device according to the present embodiment will be explained with reference to FIG. 2.

The semiconductor device according to the present embodiment includes a lower interconnection part 12 formed on a silicon substrate 10, an intermediate interconnection part 14 formed on the lower interconnection part 12 and an upper interconnection part 16 formed on the intermediate interconnection part 14. The substrate 10 additionally has semiconductor devices, such as MOS transistors, etc. formed on. In the lower interconnection part 12, interconnection layers having interconnection patterns of a smaller pitch than interconnection patterns of the interconnection layers formed in, e.g., the intermediate layer interconnection part 14 and the upper interconnection part 16 are formed, connecting points separated by short distance. In the intermediate interconnection part 14, interconnection layers having interconnection patterns of a larger pitch than the interconnection patterns of the interconnection layers formed in, e.g., the lower interconnection part 12, and a smaller pitch than interconnection patterns of the interconnection layers formed in, e.g., the upper interconnection part 16 are formed, connecting circuit blocks. In the upper interconnection part 16, interconnection layers having interconnection patterns of a larger pitch than the interconnection patterns of the interconnection layers formed in, e.g., the lower interconnection part 12 and the intermediate interconnection part 14, being utilized as source interconnections and clock interconnections.

A device isolation film 18 for defining a device region is formed on the silicon substrate 10. A MOS transistor including a gate electrode 20 and source/drain diffused layers 22 is formed in the device region of the silicon substrate 10.

An inter-layer insulation film 24 of a silicon oxide film is formed on the silicon substrate 10 with the MOS transistor formed on.

A via hole 26 is formed in the inter-layer insulation film 24 down to the source/drain diffused layer 22, and a contact plug 28 is buried in the via hole 26.

On the inter-layer insulation film 24 with the contact plug 28 buried in, an inter-layer insulation film 36 is formed of an SiC film 30, a low-k film 32 of SiOC film formed on the SiC film 30, and a hydrophilic insulation film 34 of silicon oxide film formed on the low-k film 32. An interconnection trench 38a is formed in the region of the inter-layer insulation film 36, which includes the contact plug 28. An interconnection layer 44a of a barrier metal layer 40 of Ta (tantalum) film and a Cu film 42 is buried in the interconnection trench 38a, connected to the contact plug 28. An interconnection trench 38b is formed in the other region of the hydrophilic insulation film 34, the low-k film 32 and the SiC film 30. An interconnection layer 44b of the barrier metal 40 of Ta film and the Cu film 42 is buried in the interconnection trench 38b.

On the inter-layer insulation film 36 with the interconnection layer 44a, 44b buried in, an inter-layer insulation film 56 is formed of an SiC film 46, a low-k film 48 of SiOC film formed on the SiC film 46, an SiC film 50 formed on the low-k film 48, a low-k film 52 of SiOC film formed on the SiC film 50, and a hydrophilic insulation film 54 of silicon oxide film laid on the low-k film 52. A via hole 58 is formed in the low-k film 48 and the SiC film 46 of the inter-layer insulation film 56 down to the interconnection layer 44a. An interconnection trench 60a is formed in the region of the hydrophilic insulation film 54, the low-k film 52 and the SiC film 50, which includes the via hole 58. In the via hole 58 and the interconnection trench 60a, an interconnection layer 66a of a barrier metal layer 62 of Ta film and a Cu film 64 buried, connected to the interconnection layer 44a. An interconnection trench 60b is formed in the other region of the hydrophilic insulation film 54, the low-k film 52 and the SiC film 50. In the interconnection trench 60b, an interconnection layer 66b of the barrier metal layer 62 of Ta film and the Cu film 64 is buried.

On the inter-layer insulation film 56 with the interconnection layer 66a, 66b buried in, an inter-layer insulation film 78 is formed of an SiC film 68, a low-k film 70 of SiOC film formed on the SiC film 68, an SiC film 72 formed on the low-k film 70, a low-k film 74 of SiOC film formed on the SiC film 72, and a hydrophilic insulation film 76 of silicon oxide film laid on the low-k film 74. A via hole 80 is formed in the low-k film 70 and the SiC film 68 of the inter-layer insulation film 78 down to the interconnection layer 66a. An interconnection trench 82a is formed in the region of the hydrophilic insulation film 76, the low-k film 74 and the SiC film 72, which includes the via hole 80. In the via hole 80 and the interconnection trench 82a, an interconnection layer 88a of a barrier metal layer 84 of Ta film and a Cu film 86 is buried, connected to the interconnection layer 66a. In the other region of the hydrophilic insulation film 76, the low-k film 74 and the SiC film 72, an interconnection trench 82b is formed. In the interconnection trench 82b, an interconnection layer 88b of the barrier metal layer 84 of Ta film and the Cu film 86 is buried.

On the inter-layer insulation film 78 with the interconnection layer 88a, 88b buried in, an inter-layer insulation film 100 is formed of an SiC film 90, a low-k film 92 of SiOC film formed on the SiC film 90, an SiC film 94 formed on the low-k film 92, a low-k film 96 of SiOC film formed on the SiC film 94, and a hydrophilic insulation film 98 of silicon oxide film laid on the low-k film 96. A via hole 102 is formed in the low-k film 92 and the SiC film 90 of the inter-layer insulation film 100 down to the interconnection layer 88a. An interconnection trench 104a is formed in the region of the hydrophilic insulation film 98, the low-k film 96 and the SiC film 94, which includes the via hole 102. In the via hole 102 and the interconnection trench 104a, an interconnection layer 110a of a barrier metal layer 106 of Ta film and a Cu film 108 is buried, connected to the interconnection layer 88a. An interconnection trench 104b is formed in the other region of the hydrophilic insulation film 98, the low-k film 96 and the SiC film 94. In the interconnection trench 104b, an interconnection layer 110b of the barrier metal 106 of Ta film and the Cu film 108 is buried.

On the inter-layer insulation film 100 with the interconnection layer 110a, 110b buried in, an inter-layer insulation film 122 is formed of an SiC film 112, a low-k film 114 of SiOC film formed on the SiC film 112, an SiC film 116 formed on the low-k film 114, a low-k film 118 of SiOC film formed on the SiC film 116, and a hydrophilic insulation film 120 of silicon oxide film laid on the low-k film 118. A via hole 124 is formed in the low-k film 114 and the SiC film 112 of the inter-layer insulation film 122 down to the interconnection layer 110a. An interconnection trench 126a is formed in the region of the hydrophilic insulation film 120, the low-k film 118 and the SiC film 116, which includes the via hole 124. In the via hole 124 and the interconnection trench 126a, an interconnection layer 132a of a barrier metal layer 128 of Ta film and a Cu film 130 is buried, connected to the interconnection layer 110a. In the other region of the hydrophilic insulation film 120, the low-k film 118 and the SiC film 116, an interconnection trench 126b is formed. In the interconnection trench 126b, an interconnection layer 132b of the barrier metal layer 128 of Ta film and the Cu film 130 is buried.

Thus, the lower interconnection part 12 having the five-layer multilayer interconnection structure is formed on the silicon substrate 10. In the lower interconnection part 12, the respective pitches of the interconnection patterns of the interconnection layer 44a, 44b, the interconnection layer 66a, 66b, the interconnection layers 88a, 88b, the interconnection layer 110a, 110b, and the interconnection layer 132a, 132b of the respective layers are, e.g., 0.28 μm.

On the inter-layer insulation film 122 with the interconnection layer 132a, 132b buried in, an inter-layer insulation film 142 is formed of an SiC film 134, a low-k film 136 of SiOC film formed on the SiC film 134, an SiC film 138 formed on the low-k film 136, and a low-k film 140 of SiOC film laid on the SiC film 138. A via hole 144 is formed in the low-k film 136 and the SiC film 134 of the inter-layer insulation film 142 down to the interconnection layer 132a. An interconnection trench 146a is formed in the region of the low-k film 140 and the SiC film 138, which includes the via hole 144. In the via hole 144 and the interconnection trench 146a, an interconnection layer 152a of a barrier metal layer 148 of Ta film and a Cu film 150 is buried, connected to the interconnection layer 132a. In the other region of the low-k film 140 and the SiC film 138, an interconnection trench 146b is formed. An interconnection layer 152b of the barrier metal layer 148 of Ta film and the Cu film 150 is buried in the interconnection trench 146b.

On the inter-layer insulation film 142 with the interconnection layer 152a, 152b buried in, an inter-layer insulation film 162 is formed of an SiC film 154, a low-k film 156 of SiOC film formed on the SiC film 154, an SiC film 158 formed on the low-k film 156, and a low-k film 160 of SiOC film laid on the SiC film 158. A via hole 164 is formed in the low-k film 156 and the SiC film 154 of the inter-layer insulation film 162 down to the interconnection layer 152a. An interconnection trench 166a is formed in the region of the low-k film 160 and the SiC film 158, which includes the via hole 164. In the via hole 164 and the interconnection trench 166a, an interconnection layer 172a of a barrier metal layer 168 of Ta film and a Cu film 170 is buried, connected to the interconnection layer 152a. In the other region of the low-k film 160 and the SiC film 158, an interconnection trench 166b is formed. An interconnection layer 172b of the barrier metal layer 168 of Ta film and the Cu film 170 is buried in the interconnection trench 166b.

Thus, on the lower interconnection part 12, the intermediate interconnection part 14 having the two-layer multilayer interconnection structure is formed. In the intermediate interconnection part 14, the respective pitches of the interconnection patterns of the interconnection layer 152a, 152b and the interconnection layer 172a, 172b of the respective layer are larger by, 1.5 times or more than the pitch of the interconnection patterns of the interconnection layers of the lower interconnection part 12. For example, the pitches of the interconnection patterns of the interconnection layer 152a, 152b and the interconnection layer 172a, 172b is 0.56 μm, which is respectively twice the pitch of the interconnection patterns of the interconnection layers of the lower interconnection part 12.

On the inter-layer insulation film 162 with the interconnection layer 172a, 172b buried in, an inter-layer insulation film 182 is formed of an SiC film 174, a silicon oxide film 176 formed on the SiC film 174, an SiC film 178 formed on the silicon oxide film 176, and a silicon oxide film 180 laid on the SiC film 178. A via hole 184 is formed in the silicon oxide film 176 and the SiC film 174 of the inter-layer insulation film 182 down to the interconnection layer 172a. An interconnection trench 186a is formed in the region of the silicon oxide film 180 and the SiC film 178, which includes the via hole 184. In the via hole 184 and the interconnection trench 186a, an interconnection layer 192a of a barrier metal layer 188 of Ta film and a Cu film 190 is buried, connected to the interconnection layer 172a. In the other region of the silicon oxide film 180 and the SiC film 178, an interconnection trench 186b is formed. An interconnection layer 192b of the barrier metal layer 188 of Ta film and the Cu film 190 is buried in the interconnection trench 186b.

On the inter-layer insulation film 182 with the interconnection layer 192a, 192b buried in, an inter-layer insulation film 202 is formed of an SiC film 194, a silicon oxide film 196 formed on the SiC film 194, an SiC film 198 formed on the silicon oxide film 196, and a silicon oxide film 200 laid on the SiC film 198. A via hole 204 is formed in the silicon oxide film 196 and the SiC film 194 of the inter-layer insulation film 202 down to the interconnection layer 192a. An interconnection trench 206a is formed in the region of the silicon oxide film 200 and the SiC film 198, which includes the via hole 204. In the via hole 204 and the interconnection trench 206a, an interconnection layer 212a of a barrier metal layer 208 of Ta film and a Cu film 210 is buried, connected to the interconnection layer 192a. In the other region of the silicon oxide film 200 and the SiC film 198, an interconnection trench 206b is formed. An interconnection layer 212b of the barrier metal layer 208 of Ta film and the Cu film 210 is buried in the interconnection trench 206b.

Thus, on the intermediate interconnection part 14, the upper interconnection part 16 having the two-layer multi-layer interconnection structure is formed. In the upper interconnection part 16, the pitches of the interconnection patterns of the interconnection layer 192a, 192b and the interconnection layer 212a, 212b of the respective layers are larger than the pitches of the interconnection patterns of the interconnection layers of the lower interconnection part 12 and the intermediate interconnection part 14 and are respectively, e.g., 0.84 μm.

On the inter-layer insulation film 202 with the interconnection layer 212a, 212b buried in, an inter-layer insulation film 218 comprising a SiC film 214 formed on a silicon oxide film 216 is formed. Via holes 220 are formed in the inter-layer insulation film 218 down to the interconnection layer 212a. Contact plugs 222 are buried in the via holes 220.

On the region of the inter-layer insulation film 218, which includes the contact plugs 222, an electrode 224 is formed, connected to the interconnection layer 212a through the contact plugs 222.

On the inter-layer insulation film 218 with the electrode 224 formed on, a cover film 226 is formed comprising a silicon nitride film 226b formed on a silicon oxide film 226a. An opening 228 is formed in the cover film 226 down to the electrode 224.

Thus, the semiconductor device according to the present embodiment is constituted.

The semiconductor device according to the present embodiment is characterized mainly in that the lower interconnection part 12 and the intermediate interconnection part 14 include low-k films of SiOC film as the inter-layer insulation films, and in the lower interconnection part 12, in which the interconnection layers formed in the interconnection patterns of a smaller pitch than the interconnection patterns of the interconnection layers of the intermediate interconnection part 14, the hydrophilic insulation film of silicon oxide film is formed on the low-k film, but in the intermediate interconnection part 14, in which the interconnection layers has the interconnection patterns of a larger pitch than the interconnection patterns of the interconnection layers of the lower interconnection part 12, the SiC film functioning as the diffusion preventing film is formed directly on the low-k film, without any hydrophilic insulation film formed.

The lower interconnection part 12, in which the interconnection patterns of the interconnection layers has a smaller pitch is more vulnerable to defects due to foreign matter adhering thereto. In such lower interconnection part 12, after the interconnection layer has been buried by CMP (Chemical Mechanical Polishing) or others, the hydrophilic insulation film, which is formed on the low-k film, is exposed on the surface. The hydrophilic insulation film, which is not water-repellent low-k film, is exposed, whereby foreign matter can be sufficiently removed by lift-off by HF processing following the polish by CMP or others. The exposure of the hydrophilic insulation film, which is not the water repellent low-k film, can suppress the generation of water marks due to water drops which are cause for corrosion of the interconnection layers after cleaning and drying following the polish by CMP or others. Thus, the use of the low-k film as the inter-layer insulation films in the lower interconnection part 12, which is more vulnerable to defects due to adhering foreign matter can decrease the interconnection capacitance, suppressing the occurrence of defects.

On the other hand, the interconnection layers of the intermediate interconnection part 14 are used as the interconnection layers interconnecting circuit blocks. Accordingly, it is necessary that the interconnection layers of the intermediate interconnection part 14 have the interconnection resistance decreased and has the interconnection patterns of the pitch which is, e.g., 1.5–3 times the pitch of the interconnection patterns of the interconnection layers of the lower interconnection part 12. The intermediate interconnection part 14 having such large interconnection pattern pitch is less vulnerable to defects due to foreign matter adhering thereto than the lower interconnection part 12. Accordingly, even without removing the foreign matter by lift-off by HF processing following CMP, the yield is little affected. It is not necessary to leave the hydrophilic insulation film on the low-k film. Thus, in the intermediate interconnection part 14, the SiC film functioning the diffusion preventing film is formed directly on the low-k film, and the hydrophilic insulation film, whose dielectric constant is higher than that of the low-k film, is not formed. Accordingly, the low-k film is used as the inter-layer insulation films, whereby the interconnection capacitance can be sufficiently decreased.

The interconnection layers of the upper interconnection part 16 are used as source interconnections and clock interconnections, and have interconnection patterns of a larger pitch than the interconnection patterns of the interconnection layers of the lower interconnection part 12 and the intermediate interconnection part 14. Accordingly, the upper interconnection part 16 is less required to have the interconnection capacitance decreased by using the low-k film, as are the lower interconnection part 12 and the intermediate interconnection part 14. Accordingly, in the upper interconnection part 16, silicon oxide film, whose dielectric constant is higher than low-k film, is used. As the inter-layer insulation films of the upper interconnection part 16, in addition to silicon oxide film, FSG (Fluorinated Silicate Glass) film or others may be used.

As described above, in the semiconductor device according to the present embodiment, corresponding to the functions of the interconnection layers of the multilayer interconnection structure, in the lower interconnection part 12, where the interconnection layers have the interconnection patterns of a smaller pitch than the interconnection patterns of the interconnection layers of the intermediate interconnection part 14, the occurrence of defects due to the adhesion of foreign matter is suppressed and the interconnection capacitance is decreased, and in the intermediate interconnection part 14, where the interconnection layers have the interconnection patterns of a larger pitch than the interconnection pattern of the interconnection layers of the lower interconnection part 12, the interconnection capacitance can be sufficiently decreased.

Then, the method for fabricating the semiconductor device according to the present embodiment will be explained with reference to FIGS. 3A–3E, 4A–4D, 5A–5D, 6A–6C, 7A–7C, 8A–8B, 9A–9D, 10A–10D, 11A–11C, 12A–12D, 13A–13D, 14A–14C, 15A–15C, and 16A–16B. FIGS. 3A–3E, 4A–4D, 5A–5D, 6A–6C, 7A–7C, and 8A–8B are sectional views of the semiconductor device according to the present embodiment in the steps of the method for fabricating the semiconductor device, which show the steps of fabricating the lower interconnection part 12. FIGS. 9A–9D, 10A–10D, and 11A–11C are sectional views of the semiconductor device according to the present embodiment in the steps of the method for fabricating the semiconductor device, which show the steps of fabricating the intermediate interconnection part 14. FIGS. 12A–12D, 13A–13D, 14A–14C, 15A–15C, and 16A–16B are sectional views of the semiconductor device according to the present embodiment in the steps of the method for fabricating the semiconductor device, which show the steps of fabricating the upper interconnection part 16, the electrode, etc.

The device isolation film 18 for defining a device region is formed on the silicon substrate 10 by, e.g., STI (Shallow Trench Isolation).

Figure 3A:
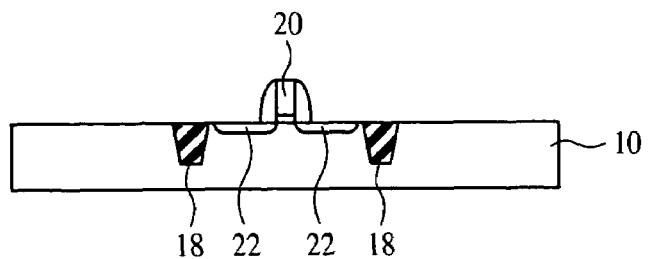
FIGS. 3A–3E are sectional views of the semiconductor device according to the embodiment of the present invention in the steps of the method for fabricating the semiconductor device, which show the method (Part 1).

Next, on the silicon substrate 10 with the device isolation film 18 formed on, a MOS transistor including the gate electrode 20 and the source/drain diffused layers 22 is formed in the same way as in, e.g., the usual MOS transistor fabricating method (see FIG. 3A). On the silicon substrate 10, not only MOS transistors but also various semiconductor devices can be fabricated.

Next, the inter-layer insulation film 24 of a silicon oxide film of, e.g., a 700 nm-thickness is formed by, e.g., CVD (Chemical Vapor Deposition) on the silicon substrate 10 with the MOS transistor formed on.

Figure 3B:
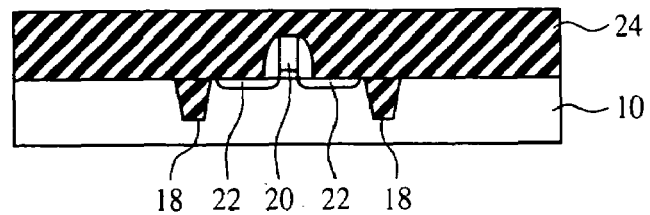

Next, the surface of the inter-layer insulation film 24 is polished by, e.g., CMP until the film thickness of the inter-layer insulation film 24 becomes, e.g., 400 nm to thereby flatten the surface of the inter-layer insulation film 24 (see FIG. 3B).

Then, the contact hole 26 is formed in the inter-layer insulation film 24 by photolithography and dry etching down to the silicon substrate 10.

Next, a Ti (titanium) film of, e.g., a 10 nm-thickness, a TiN (titanium nitride) film of, e.g., a 10 nm-thickness and a W (tungsten) film of, e.g., a 300 nm-thickness are formed by, e.g., CVD.

Figure 3C:
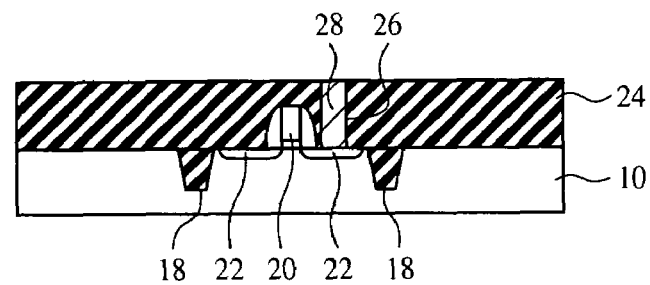
Figure 3D:
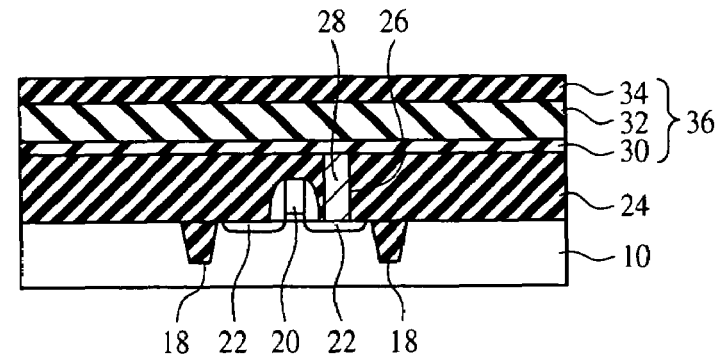

The W film, the TiN film and the Ti film are removed flat by, e.g., CMP until the surface of the inter-layer insulation film 24 is exposed to thereby form the contact plug 28 of the Ti film, the TiN film and the W film buried in the contact hole 26 (see FIG. 3C).

Then, on the inter-layer insulation film 24 with the contact plug 28 buried in, the SiC film 30 of, e.g., a 30 nm-thickness is formed by, e.g., plasma CVD.

Next, the low-k film 32 of an SiOC film of, e.g., a 200 nm-thickness is formed on the SiC film 30 by, e.g., plasma CVD.

Then, the hydrophilic insulation film 34 of a silicon oxide film, of e.g., a 100 nm-thickness is formed on the low-k film 30 by, e.g., plasma CVD using TEOS (tetraethyoxysilane) as the main material. The hydrophilic insulation film 34 is formed in a larger film thickness than the hydrophilic insulation film 244 to be formed in the intermediate interconnection part 14, which will be described later.

Thus, the inter-layer insulation film 36 of the layer structure of the hydrophilic insulation film 34/the low-k film 32/the SiC film 30 is formed (see FIG. 3D) The SiC film 30 functions as the etching stopper film and the Cu diffusion preventing film.

Next, the silicon nitride film 232 of, e.g., a 50 nm-thickness is formed on the hydrophilic insulation film 34 by, e.g., CVD. The silicon nitride film 232 functions as the ARC (Anti-reflection Coating) film in the following photolithography step.

Figure 3E:
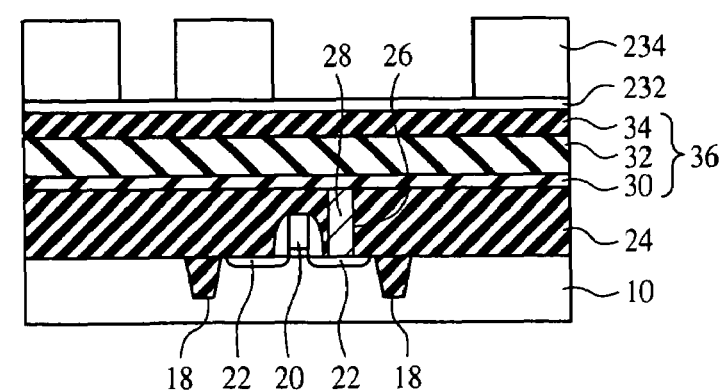

Then, a photoresist film 234 for exposing regions for the interconnection trenches 38a, 38b to be formed in the inter-layer insulation film 36 are formed on the silicon nitride film 232 by photolithography (see FIG. 3E).

Then, with the photoresist film 234 as a mask and the SiC film 30 as a stopper, the silicon nitride film 232, the hydrophilic insulation film 34 and the low-k film 32 are sequentially etched. Thus, the interconnection trenches 38a, 38b are formed in the hydrophilic insulation film 34 and the low-k film 32 (see FIG. 4A).

Then, after the photoresist film 234 has been removed, the SiC film 30 on the bottoms of the interconnection trenches 38a, 38b is etched to open the interconnection trenches 38a, 38b down to the inter-layer insulation film 24. At this time, the silicon nitride film 232 on the hydrophilic insulation film 34 is also etched off (see FIG. 4B).

Next, the barrier metal layer 40 of a Ta film of, e.g., 10 nm-thickness and the Cu film of, e.g., a 100 nm-thickness are continuously formed on the entire surface by, e.g., sputtering.

Figure 4A:
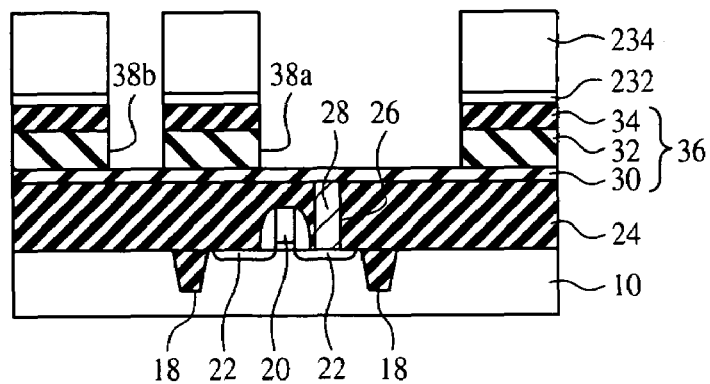
FIGS. 4A–4D are sectional views of the semiconductor device according to the embodiment of the present invention in the steps of the method for fabricating the semiconductor device, which show the method (Part 2).
Figure 4B:
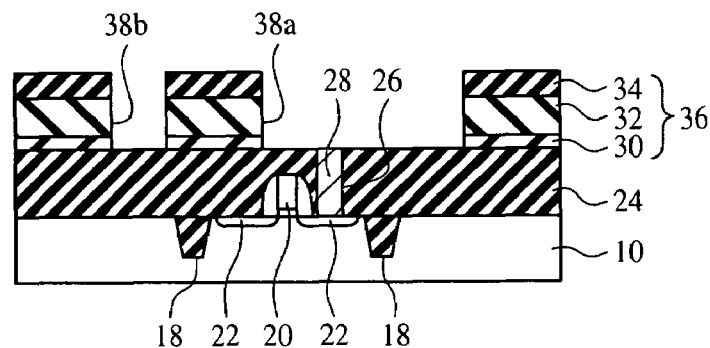
Figure 4C:
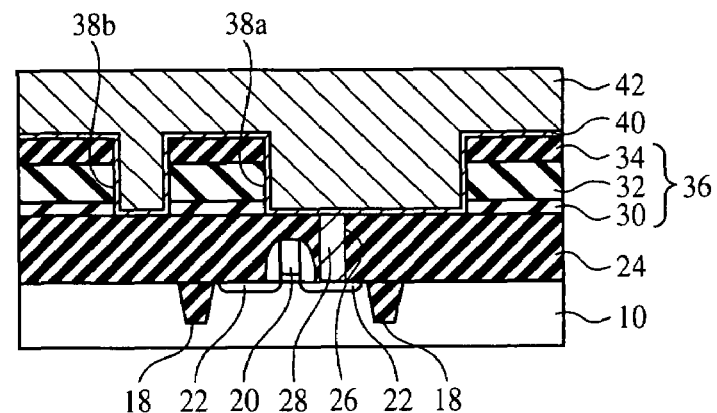
Figure 4D:
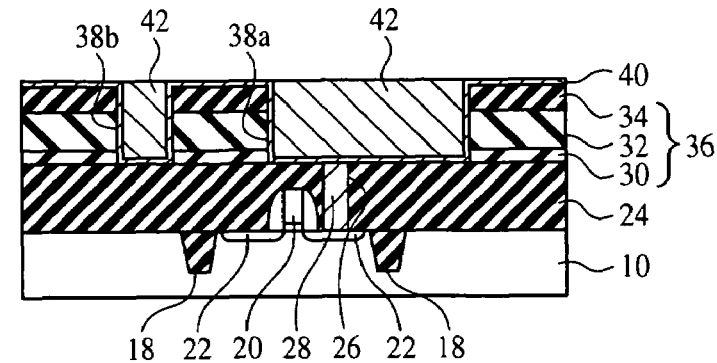

Then, with the Cu film formed on the barrier metal layer 40 as a seed, a Cu film is further deposited by electrolytic plating to form the Cu film 42 of, e.g., a 1.0 µm-total film thickness (see FIG. 4C).

Then, the Cu film 42 and the barrier metal layer 40 of the Ta film are polished off flat by CMP to thereby form the interconnection layer 44a buried in the interconnection trench 38a and the interconnection layer 38b buried in the interconnection trench 38b. At this time, first, the Cu film 42 is selectively polished under conditions which provide a sufficient selectivity for the barrier metal layer 40 of Ta film, and the polish is stopped at the surface of the barrier metal layer (see FIG. 4D). Subsequently, the polishing conditions are suitably reset to polished the barrier metal layer 40 of Ta film to expose the hydrophilic insulation film 34 (see FIG.

5A). The polishing conditions by CMP are thus set to thereby facilitate controlling the over-polish amount of the hydrophilic insulation film 34 of the silicon oxide film below the barrier metal layer 40. Resultantly, after the Cu film 42 and the barrier metal layer 40 have been removed, the hydrophilic insulation film 34 can be easily set in a required film thickness. The film thickness of the hydrophilic insulation film 34 after the removal of the Cu film 42 and the barrier metal layer 40 is, e.g., 50 nm.

Figure 5A:
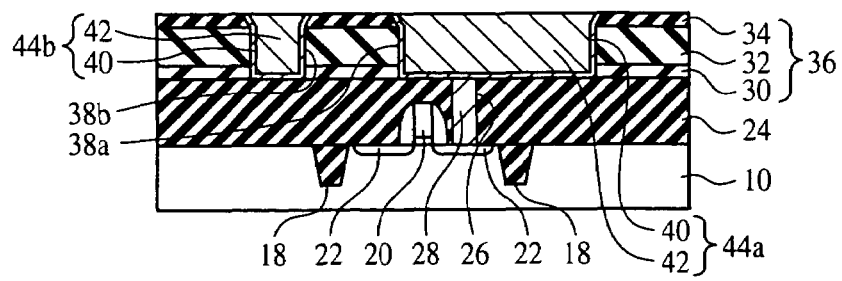
FIGS. 5A–5D are sectional views of the semiconductor device according to the embodiment of the present invention in the steps of the method for fabricating the semiconductor device, which show the method (Part 3).

Thus are formed the interconnection layer 44a buried in the interconnection trench 38a and including the barrier metal layer 40 of the Ta film for preventing the diffusion of the Cu, and the Cu film 42 forming the major part of the interconnection layer, and the interconnection layer 44b buried in the interconnection trench 38b and including the barrier metal layer 40 of the Ta film for preventing the diffusion of the Cu, and the Cu film 42 forming the major part of the interconnection layer (see FIG. 5A).

After the interconnection layer 44a, 44b has been buried by CMP, prescribed cleaning processing is performed. At this time, HF processing is performed to remove foreign matter adhering to the surface by lift-off. In the HF processing, because of the hydrophilic insulation film 34, not the water-repellent low-k film 32, which is exposed on the surface, the foreign matter can be sufficiently removed by the lift-off. The exposure of the hydrophilic insulation film 34, not the water-repellent low-k film 32, can suppress the occurrence of water marks due to water drops, which cause corrosion of the interconnection layers after cleaned and dried.

Next, the SiC film 46 of, e.g., a 50 nm-thickness is formed by, e.g., plasma CVD on the inter-layer insulation film 36 with the interconnection layers 44a, 44b buried in.

Next, the low-k film 48 of a SiOC film of, e.g., a 250 nm-thickness is formed on the SiC film 46 by, e.g., plasma CVD.

Then, the SiC film 50 of, e.g., a 30 nm-thickness is formed on the low-k film 48 by, e.g., plasma CVD.

Next, the low-k film 52 of an SiOC film of, e.g., a 200 nm-thickness is formed on the SiC film 50 by, e.g., plasma CVD.

Next, the hydrophilic insulation film 54 of a silicon oxide film of, e.g., a 100 nm-thickness is formed on the low-k film 52 by plasma CVD using, e.g., TEOS as the main material. The hydrophilic insulation film 54 is formed in a larger film thickness than the hydrophilic insulation film 244 to be formed in the intermediate interconnection part 14, which will be described later.

Figure 5B:
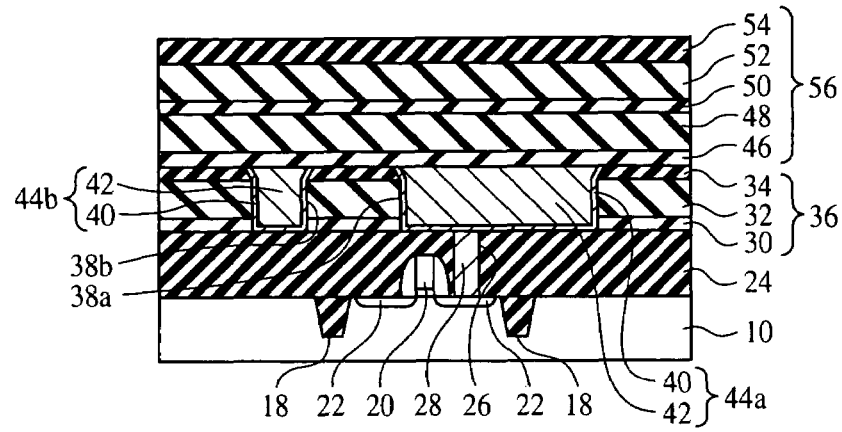

Thus, the inter-layer insulation film 56 of the layer structure of the hydrophilic insulation film 54/the low-k film 52/the SiC film 50/the low-k film 48/the SiC film 46 is formed (see FIG. 5B). The SiC films 46, 50 function as the etching stopper film and the Cu diffusion preventing film.

Then, the silicon nitride film 236 of, e.g., a 50 nm-thickness is formed on the hydrophilic insulation film 54 by, e.g., CVD. The silicon nitride film 236 functions as the ARC film in the following photolithography step.

Figure 5C:
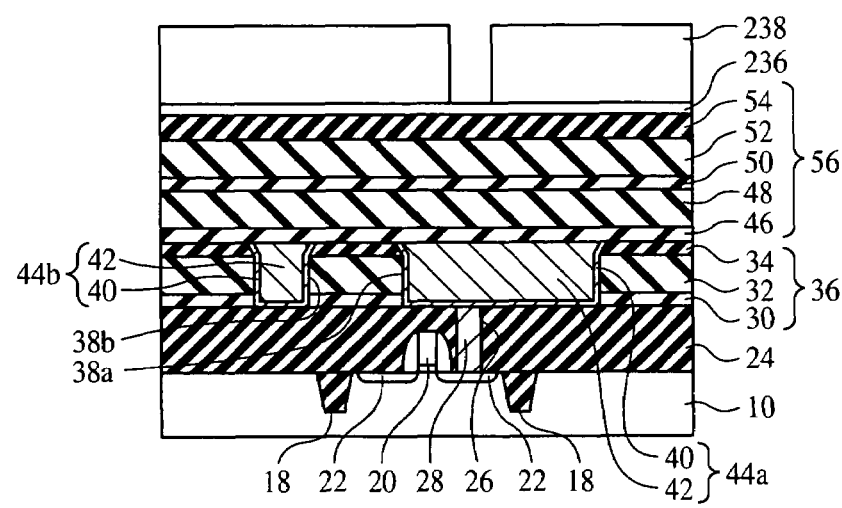
Figure 5D:
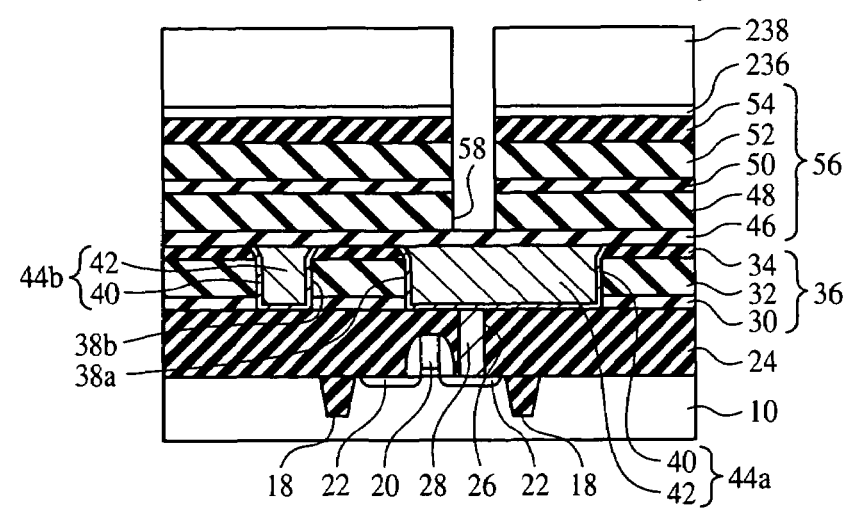

Next, a photoresist film 238 for exposing the region for the via hole 58 to be formed in the low-k film 48 and the SiC film 46 is formed on the silicon nitride film 236 by photolithography (see FIG. 5C).

Then, with the photoresist film 238 as a mask, the silicon nitride film 236, the hydrophilic insulation film 54, the low-k film 52, the SiC film 50 and the low-k film 48 are sequentially etched under suitably changed conditions. Thus, the via hole 58 is formed in the low-k film 46 (see FIG. 5D).

After the via hole 58 has been formed, the photoresist film 238 is removed.

Then, a resin 240 is buried in the via hole 58 by, e.g., spin coating. Then the resin 240 on the silicon nitride film 236 is removed by ashing using, e.g., $O_2$ plasma, and the resin 240 in the via hole 58 is etched back to a prescribed height until, for example, the upper surface of the resin 240 is positioned near the border between the SiC film 50 and the low-k film 52 (see FIG. 6A).

Figure 6A:
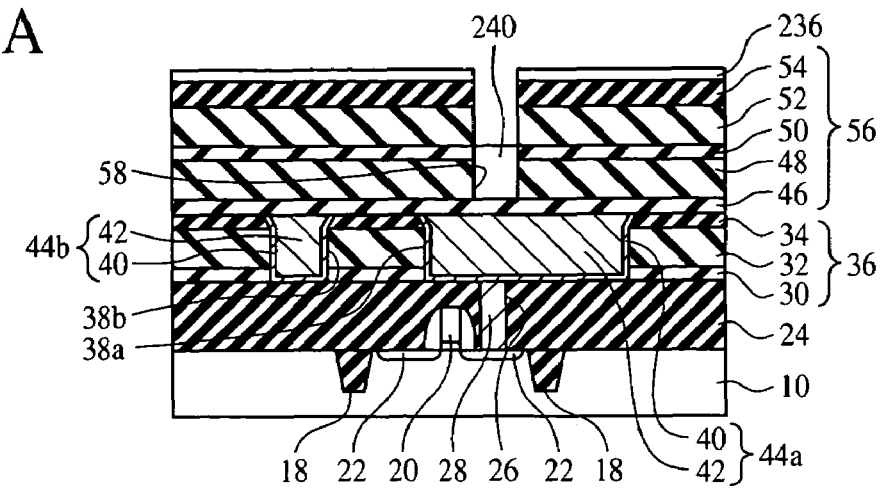
FIGS. 6A–6C are sectional views of the semiconductor device according to the embodiment of the present invention in the steps of the method for fabricating the semiconductor device, which show the method (Part 4).
Figure 6B:
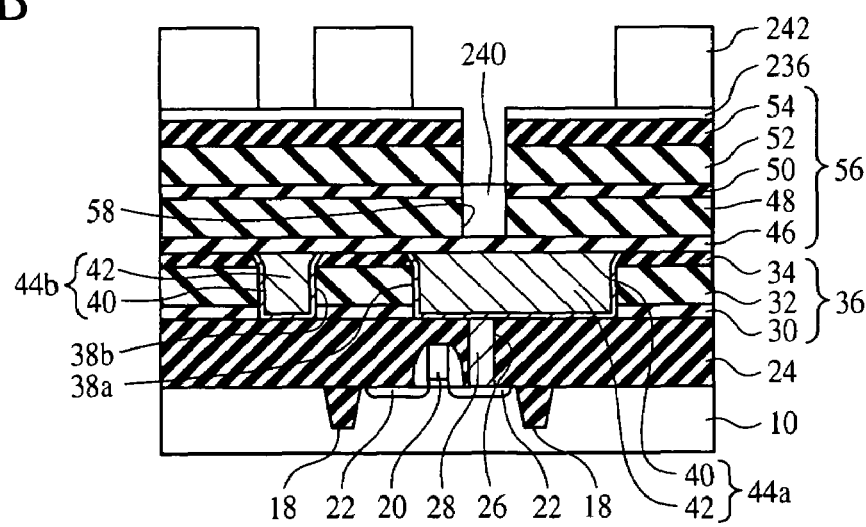
Figure 6C:
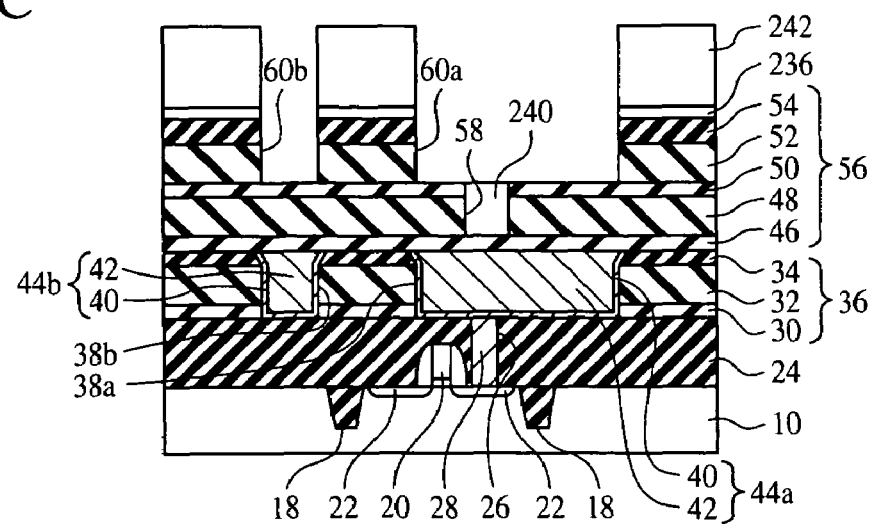

Next, a photoresist film 242 for exposing the regions for the interconnection trenches 60a, 60b to be formed in the inter-layer insulation film 56 is formed on the silicon nitride film 236 (see FIG. 6B). At this time, the photoresist film 242 is formed of a material which does not mix with the resin 240 and whose developer does not solve the resin 240.

Then, with the photoresist film 242 as a mask and the SiC film 50 as a stopper, the silicon nitride film 236, the hydrophilic insulation film 54 and the low-k film 52 are sequentially etched. Thus, the interconnection trenches 60a, 60b are formed in the hydrophilic insulation film 54 and the low-k film 52 (see FIG. 6C).

Then, the photoresist film 242 and the resin 240 in the via hole 58 are removed by ashing using, e.g., $O_2$ plasma and $CF_4$ plasma.

Then under conditions which provide a sufficient selectivity with respect to SiOC film, the SiC film 50 on the bottoms of the interconnection trenches 60a, 60b and the SiC film 46 on the bottom of the via hole 58 are etched to open the interconnection trenches 60a, 60b down to the low-k film 48 and the via hole 58 down to the interconnection layer 44a. At this time, the silicon nitride film 236 on the hydrophilic insulation film 54 is also etched off (see FIG. 7A).

Next, the barrier metal layer 62 of a Ta film of, e.g., a 25 nm-thickness and a Cu film of, e.g., a 100 nm-thickness are continuously deposited on the entire surface by, e.g., sputtering. After the interconnection trenches 60a, 60b and the via hole 58 have been formed and before the Ta film is deposited, pre-processing, such as Ar (argon) sputtering, $H_2$ plasma processing, $H_2$ annealing, etc. may be performed in-situ.

Figure 7A:
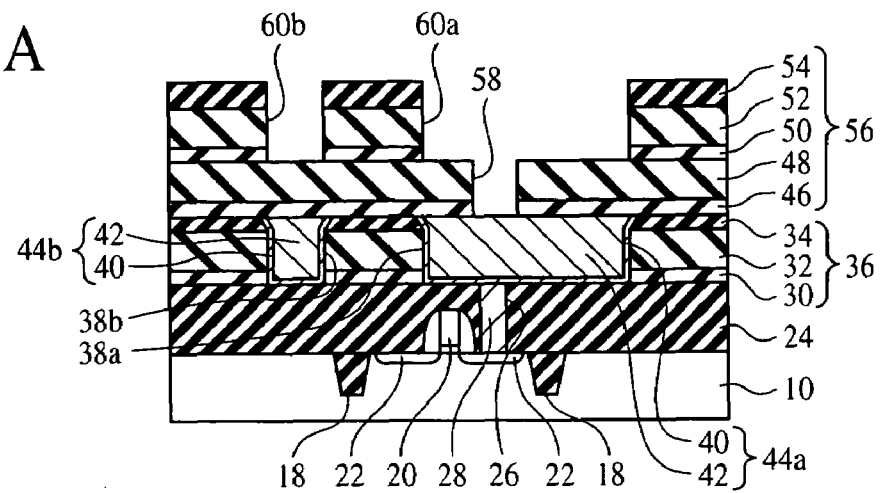
FIGS. 7A–7C are sectional views of the semiconductor device according to the embodiment of the present invention in the steps of the method for fabricating the semiconductor device, which show the method (Part 5).
Figure 7B:
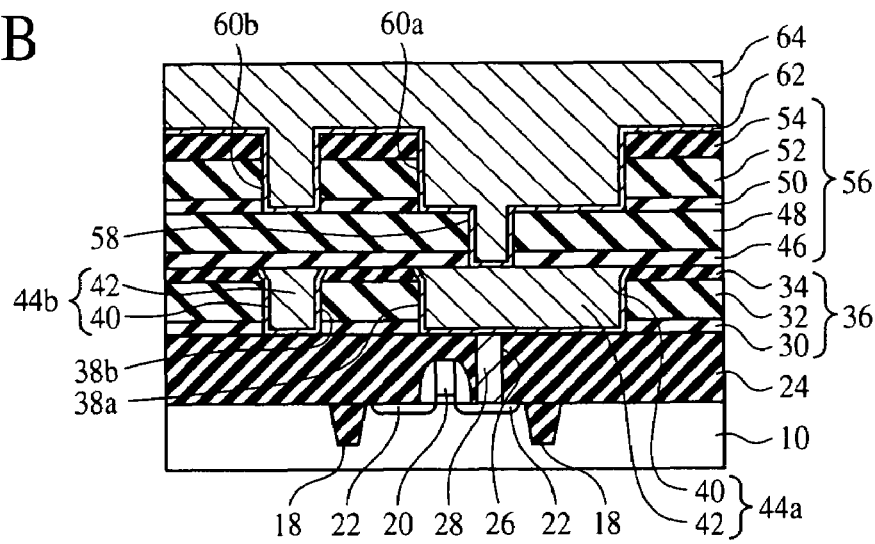
Figure 7C:
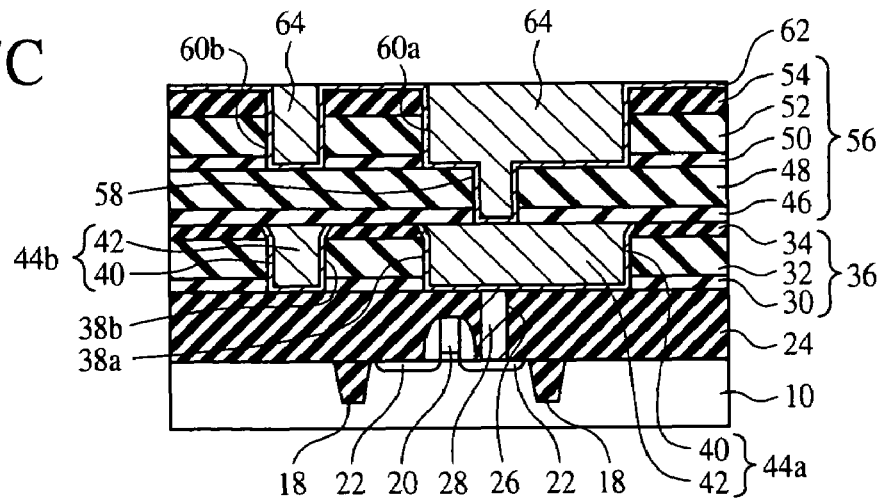

Next, with the Cu film formed on the barrier metal layer 62 as a seed, a Cu film is further deposited by electrolytic plating to form the Cu film 64 of, e.g., a 1.0 μm-total thickness (see FIG. 7B).

Then, the Cu film 64 and the barrier metal layer 62 of the Ta film is polished off flat by CMP to form the interconnection layer 66a buried in the interconnection trench 60a and the via hole 58 and the interconnection layer 66b buried in the interconnection trench 60b. At this time, as in forming the interconnection layer 44a, 44b, the Cu film 64 is selectively polished under conditions which provide sufficient selectivity with respect to the barrier metal layer 62 of Ta film, and the polish is stopped at the surface of the barrier metal layer 62 (see FIG. 7C). Subsequently, the polishing conditions are suitably reset to polish the barrier metal layer 62 of Ta film to expose the hydrophilic insulation film 54 (see FIG. 8A). The polishing conditions by CMP are thus set to thereby facilitate controlling the over-polish amount of the hydrophilic insulation film 54 of the silicon oxide film below the barrier metal layer 62. Resultantly, after the Cu film 64 and the barrier metal layer 62 have been removed, the hydrophilic insulation film 54 can be easily set in a required film thickness. The film thickness of the hydrophilic insulation film 54 after the removal of the Cu film 64 and the barrier metal layer 62 is, e.g., 50 nm.

Figure 8A:
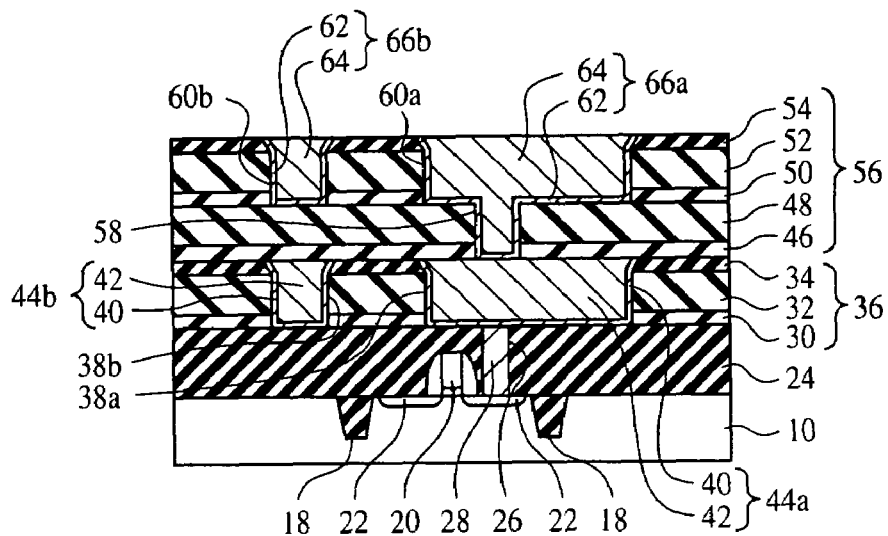
FIGS. 8A–8B are sectional views of the semiconductor device according to the embodiment of the present invention in the steps of the method for fabricating the semiconductor device, which show the method (Part 6).

Thus, the interconnection layer 66a buried in the via hole 58 and the interconnection trench 60a and including the barrier metal 62 of Ta film for preventing the diffusion of the Cu and the Cu film 64 forming the major part of the interconnection layer, and the interconnection layer 66b buried in the interconnection trench 60b and including the barrier metal layer 62 of Ta film for preventing the diffusion of the Cu and the Cu film 64 forming the major part of the interconnection layer are formed (see FIG. 8A).

After the interconnection layer 66a, 66b has been buried in by CMP, prescribed cleaning processing is performed. At this time, HF processing is performed to remove the foreign matter adhering to the surface by the lift-off. In the HF processing, because of the hydrophilic insulation film 54, not the water-repellent low-k film 52, which is exposed on the surface, the foreign matter can be sufficiently removed by the lift-off. The exposure of the hydrophilic insulation film 54, not the water-repellent low-k film 52, can suppress the occurrence of water marks due to water drops, which cause corrosion of the interconnection layers after cleaned and dried.

Next, the same steps as shown in FIG. 5B to FIG. 8A are repeated to form the interconnection layer 88a, 88b buried in the inter-layer insulation film 78, the interconnection layer 110a, 110b buried in the inter-layer insulation film 100 and the interconnection layer 132a, 132b buried in the inter-layer insulation film 122.

Figure 8B:
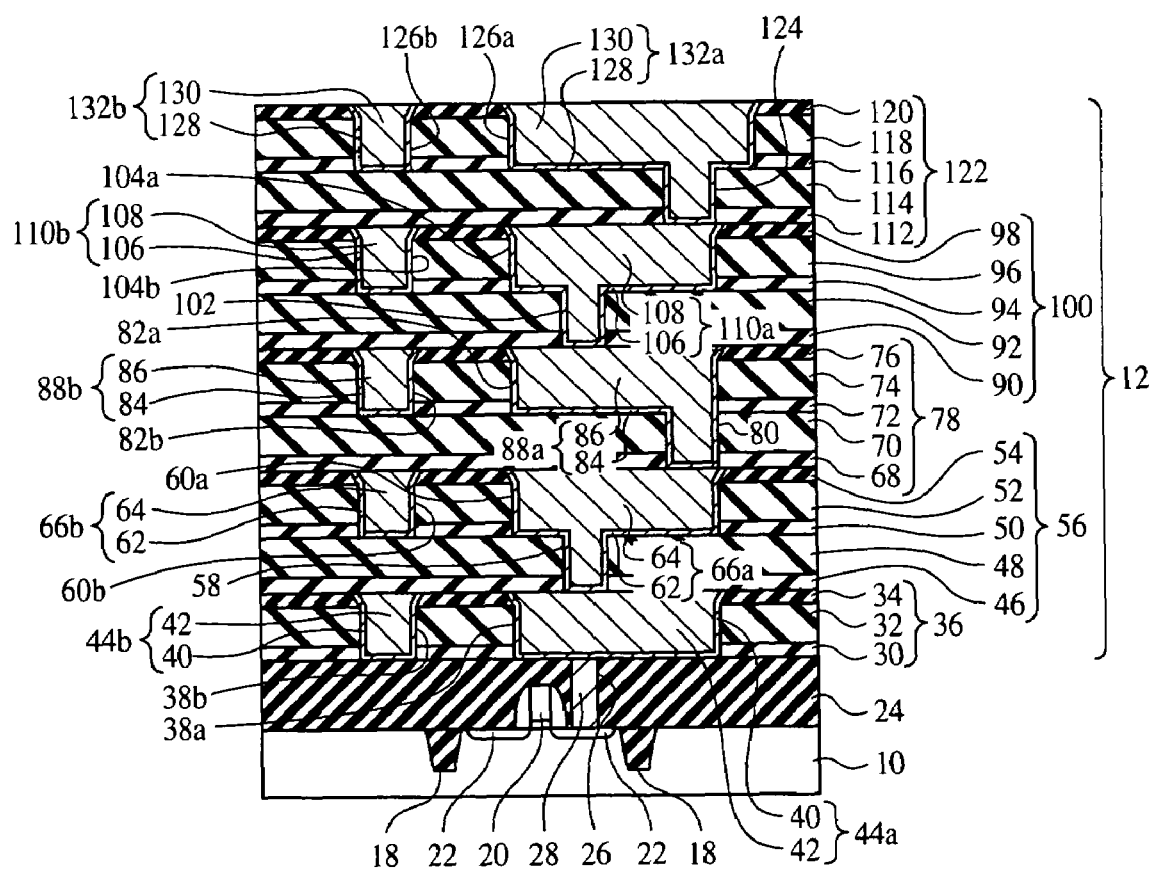

Thus, the lower interconnection part 12 having the five-layer multilayer interconnection structure is formed on the silicon substrate 10 (see FIG. 8B). The interconnection layer 44a, 44b, the interconnection layer 66a, 66b, the interconnection layer 88a, 88b, the interconnection layer 110a, 110b and the interconnection layer 132a, 132b of the lower interconnection part 12 are formed in the interconnection patterns of respectively, e.g., a 0.28 µm pitch.

Then, the SiC film 134 of, e.g., a 70 nm-thickness is formed by, e.g., plasma CVD on the inter-layer insulation film 122 with the interconnection layer 132a, 132b of the interconnection part 12 buried in.

Then, the low-k film 136 of an SiOC film of, e.g., a 530 nm-thickness is formed on the SiC film 134 by, e.g., plasma CVD.

Next, the SiC film 138 of, e.g., a 30 nm-thickness is formed on the low-k film 136 by, e.g., plasma CVD.

Then, the low-k film 140 of an SiOC film of, e.g., a 400 nm-thickness is formed on the SiC film 138 by, e.g., plasma CVD.

Thus, the inter-layer insulation film 142 of the layer structure of the low-k film 140/the SiC film 138/the low-k film 136/the SiC film 134 is formed. The SiC films 134, 138 function as the etching stopper film and the Cu diffusion preventing film.

Figure 9A:
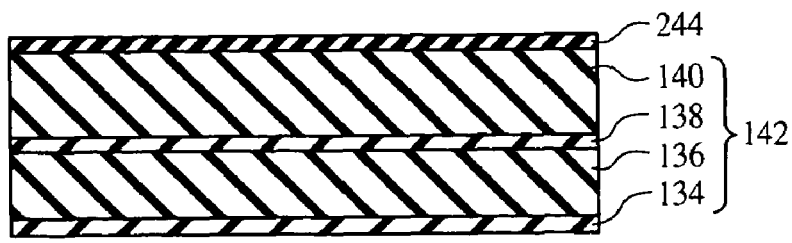
FIGS. 9A–9D are sectional views of the semiconductor device according to the embodiment of the present invention in the steps of the method for fabricating the semiconductor device, which show the method (Part 7).

Then, the hydrophilic insulation film 244 of a silicon oxide film of, e.g., a 30 nm-thickness is formed on the low-k film 140 by plasma CVS using, e.g., TEOS as the main material (see FIG. 9A). The hydrophilic insulation film 244 is formed in a smaller thickness than the hydrophilic insulation films 34, 54, 76, 98, 120 formed in the lower interconnection part 12. In the drawings of FIG. 9A and the followers, the structure below the SiC film 134 is omitted.

Next, the silicon nitride film 246 of, e.g., a 50 nm-thickness is formed on the hydrophilic insulation film 244 by, e.g., CVD. The silicon nitride film 246 functions as an ARC film in the following photolithography step.

Figure 9B:
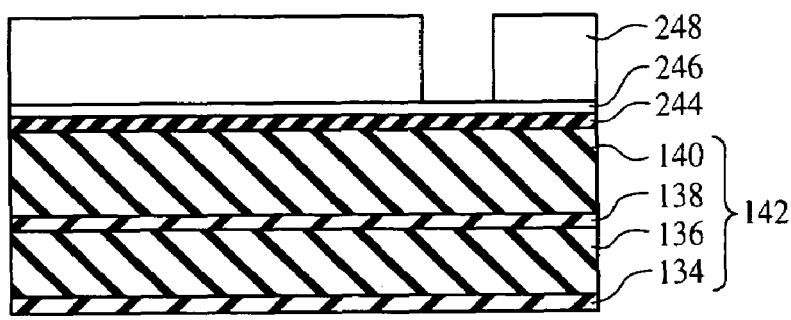

Then, a photoresist film 248 for exposing the region for the via hole 144 which is to be formed in the low-k film 136 and the SiC film 134 is formed on the silicon nitride film 246 by photolithography (see FIG. 9B).

Then, with the photoresist film 248 as a mask, the silicon nitride film 246, the hydrophilic insulation film 244, the low-k film 140, the SiC film 138 and the low-k film 136 are sequentially etched under suitably changed conditions. Thus, the via hole 144 is formed in the low-k film 136 (see FIG. 9C).

After the via hole 144 has been formed, the photoresist film 248 is removed.

Figure 9C:
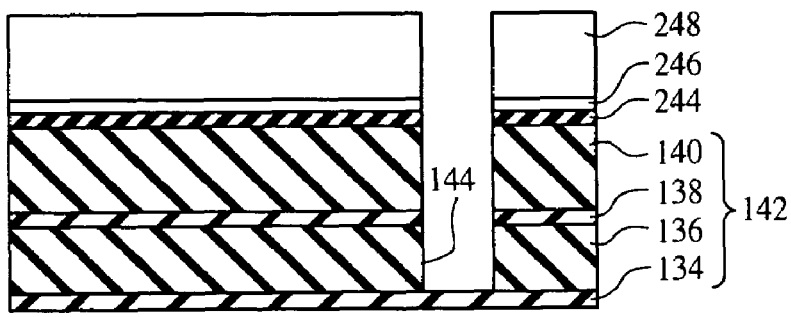
Figure 9D:
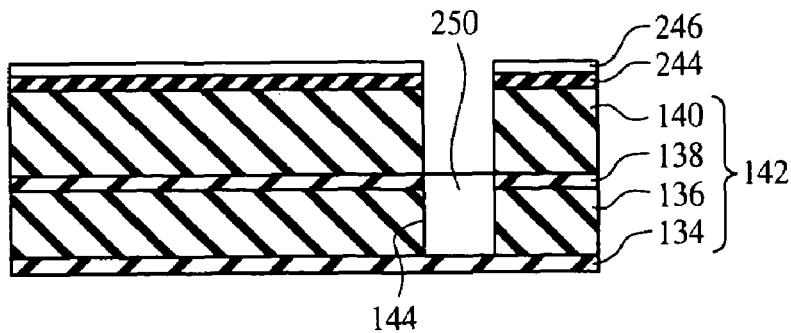

Then, after the resin 250 has been buried in the via hole 144 by, e.g., spin coating, the resin 250 on the silicon nitride film 246 is removed by ashing using, e.g., $O_2$ plasma, and the resin 250 in the via hole 144 is etched back to a prescribed height until, for example, the upper surface of the resin 250 is positioned near the border between the SiC film 138 and the low-k film 140 (see FIG. 9C).

Figure 10A:
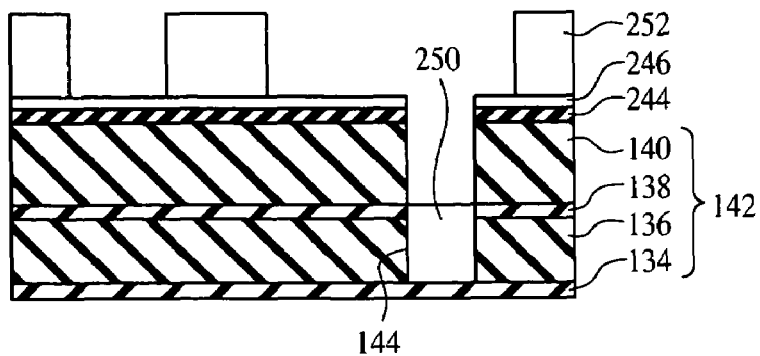
FIGS. 10A–10D are sectional views of the semiconductor device according to the embodiment of the present invention in the steps of the method for fabricating the semiconductor device, which show the method (Part 8).
Figure 10B:
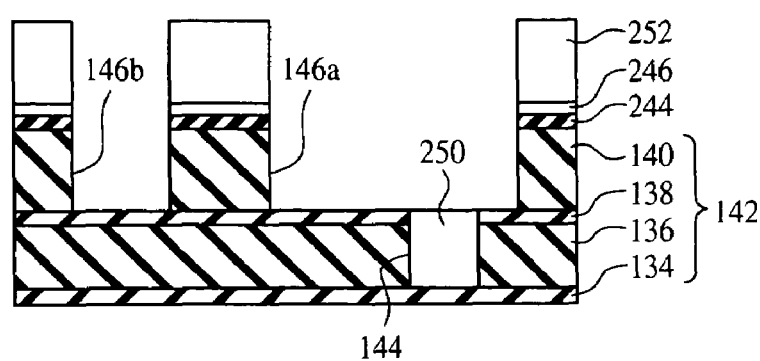

Then, a photoresist film 252 for exposing the regions for the interconnection trenches 146a, 146b to be formed in the inter-layer insulation film 142 is formed on the silicon nitride film 246 (see FIG. 10A). At this time, the photoresist film 252 is formed of a material which does not mix with the resin 250 and whose developer does not solve the resin 250.

Then, with the photoresist film 252 as a mask and the SiC film 138 as a stopper, the silicon nitride film 246, the hydrophilic insulation film 244 and the low-k film 140 are sequentially etched. Thus, the interconnection trenches 146a, 146b are formed in the low-k film 140 (see FIG. 10B). The interconnection trenches 146a, 146b are formed in an interconnection pattern of a larger pitch than the interconnection pattern of the interconnection trenches of the lower interconnection part 12.

Then, the photoresist film 252 and the resin 250 in the via hole 144 are removed by ashing using, e.g., $O_2$ plasma and $CF_4$ plasma.

Next, under conditions which provide a sufficient selectivity with respect to SiOC film, the SiC film 138 on the bottoms of the interconnection trenches 146a, 146b and the SiC film 134 on the bottom of the via hole 144 are etched to open the interconnection trenches 146a, 146b down to the low-k film 136 and the via hole 144 down to the interconnection layer 132a of the lower interconnection part 12. At this time, the silicon nitride film 246 on the hydrophilic insulation film 244 is also etched off (see FIG. 10C).

Then, the barrier metal layer 148 of a Ta film of, e.g., a 25 nm-thickness and a Cu film of, e.g., a 100 nm-thickness are continuously deposited on the entire surface by, e.g., sputtering. After the formation of the interconnection trenches 146a, 146b and the via hole 144, and before the formation of the Ta film, pre-processing, such as Ar (argon) sputtering, $H_2$ plasma processing, $H_2$ annealing, etc., may be performed in-situ.

Figure 10C:
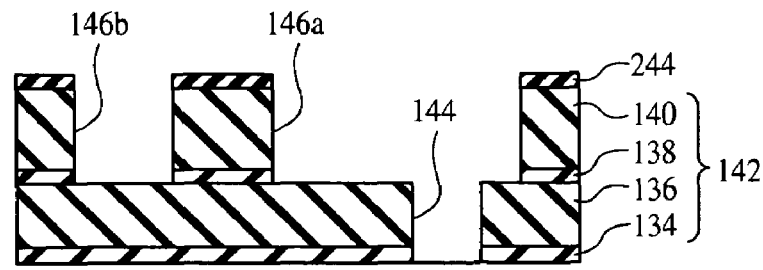
Figure 10D:
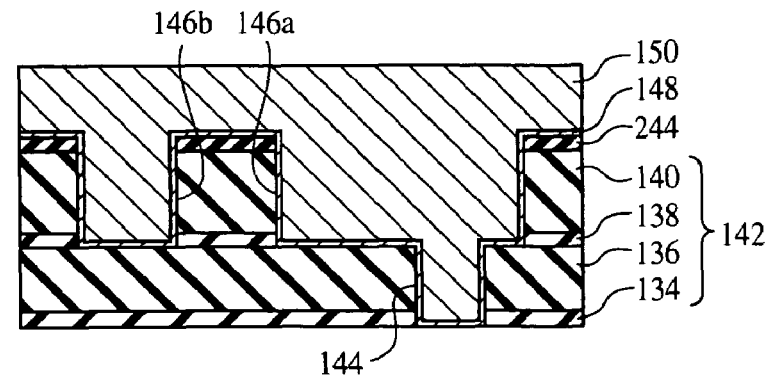

Then, with the Cu film formed on the barrier metal layer 148 as a seed, a Cu film is further deposited by electrolytic plating to form the Cu film 150 of, e.g., a 1.0 µm-total thickness (see FIG. 10C).

Then, the Cu film 150, the barrier metal layer 148 of the Ta film, and hydrophilic insulation film 244 are polished off flat by CMP to form the interconnection layer 152a buried in the interconnection trench 146a and the via hole 144 and the interconnection layer 152b buried in the interconnection trench 146b. At this time, the Cu film 150 is selectively polished under conditions which provide a high selectivity with respect to the barrier metal layer 148 of Ta film, and the polish is stopped at the surface of the barrier metal layer 148 (see FIG. 11A). Subsequently, the polishing conditions are reset, and under conditions which make the polishing rate of the barrier metal layer 148 of Ta film approximate to the polishing rate of the hydrophilic insulation film 244 of silicon oxide film, the barrier metal layer 148 and the hydrophilic insulation film 244 are polished to expose the low-k film 140 (see FIG. 11B).

Figure 11A:
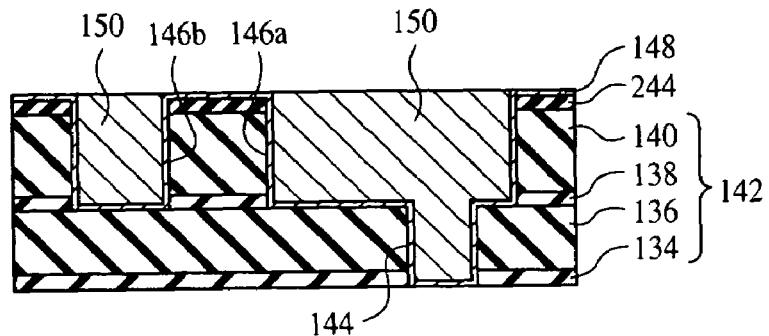
FIGS. 11A–11C are sectional views of the semiconductor device according to the embodiment of the present invention in the steps of the method for fabricating the semiconductor device, which show the method (Part 9).
Figure 11B:
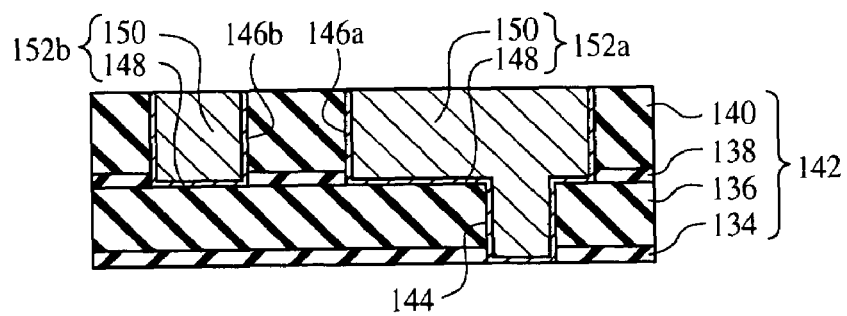

Thus, the interconnection layer 152a buried in the via hole 144 and the interconnection trench 146a and including the barrier metal 148 of Ta film for preventing the diffusion of the Cu and the Cu film 150 forming the major part of the interconnection layer, and the interconnection layer 152b buried in the interconnection trench 146b and including the barrier metal layer 148 of Ta film for preventing the diffusion of the Cu and the Cu film 150 forming the major part of the interconnection layer are formed (see FIG. 11B).

Figure 11C:
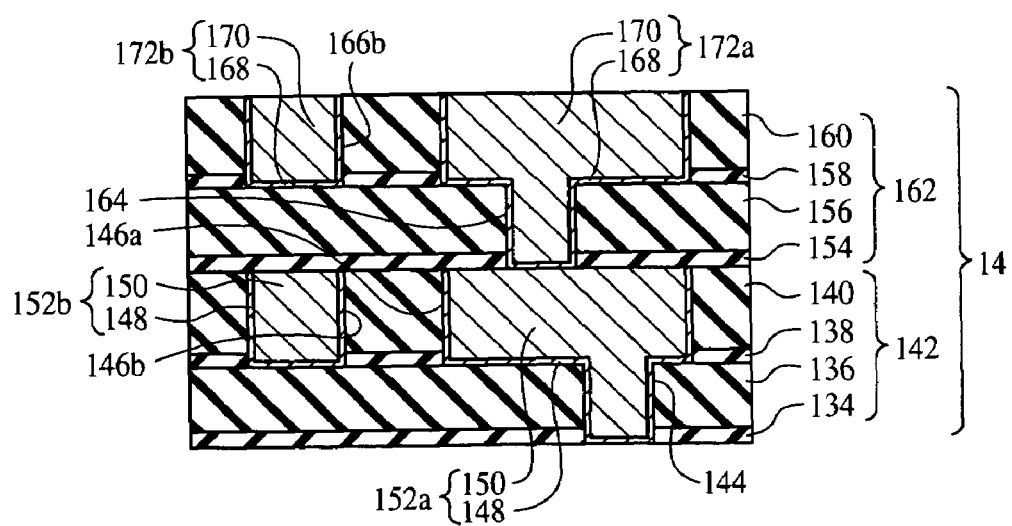

Then, the same steps shown in FIGS. 9A to 11B are repeated to form the interconnection layer 172a, 172b buried in the inter-layer insulation film 162 (see FIG. 11C).

Thus, the intermediate interconnection part 14 having the two-layer multilayer interconnection structure is formed on the lower interconnection part 12. The interconnection layer 152a, 152b and the interconnection layer 172a, 172b of the intermediate interconnection part 14 are formed in the interconnection patterns respectively of a pitch which is larger by, e.g., 1.5 times or more than the pitch of the interconnection layers of the lower interconnection part 12. For example, the interconnection layer 152a, 152b and the interconnection layer 172a, 172b are formed in the interconnection patterns of respectively, e.g., a 0.56 µm pitch.

Next, the SiC film 174 of, e.g., a 70 nm-thickness is formed by, e.g., plasma CVD on the inter-layer insulation film 162 with the interconnection layers 172a, 172b of the intermediate interconnection part 14 buried in.

Next, the silicon oxide film 176 of, e.g., a 530 nm-thickness is formed on the SiC film 174 by, e.g., plasma CVD.

Then, the SiC film 178 of, e.g., a 30 nm-thickness is formed on the silicon oxide film 176 by, e.g., plasma CVD.

Then, the silicon oxide film 180 of, e.g., a 900 nm-thickness is formed on the SiC film 178 by, e.g., plasma CVD.

Figure 12A:
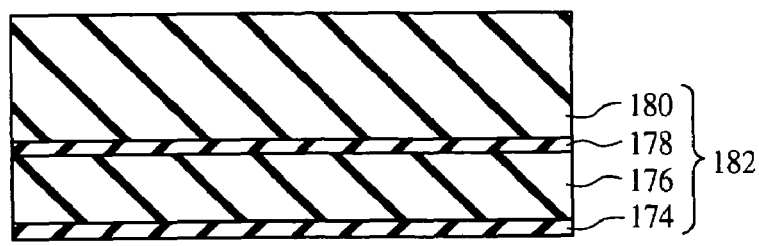
FIGS. 12A–12D are sectional views of the semiconductor device according to the embodiment of the present invention in the steps of the method for fabricating the semiconductor device, which show the method (Part 10).

Thus, the inter-layer insulation film 182 of the layer structure of the silicon oxide film 180/the SiC film 178/the silicon oxide film 176/the SiC film 174 is formed (see FIG. 12A). The SiC films 174, 178 function as the etching stopper film and the Cu diffusion preventing film. In the drawing of FIG. 12A and the followers, the structure below the SiC film 174 is omitted.

Then, the silicon nitride film 254 of, e.g., a 50 nm-thickness is formed on the silicon oxide film 180 by, e.g., CVD. The silicon nitride film 254 functions as the ARC film in the following photolithography step.

Figure 12B:
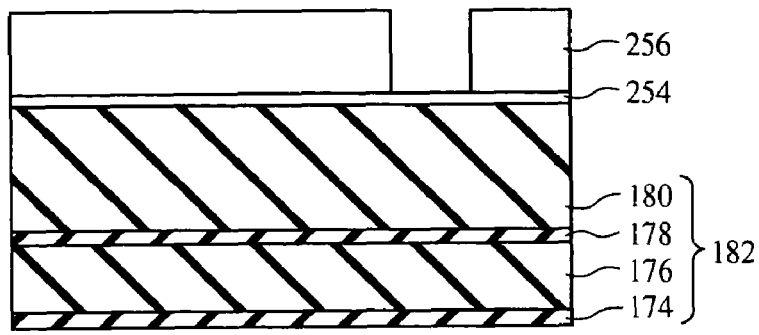
Figure 12C:
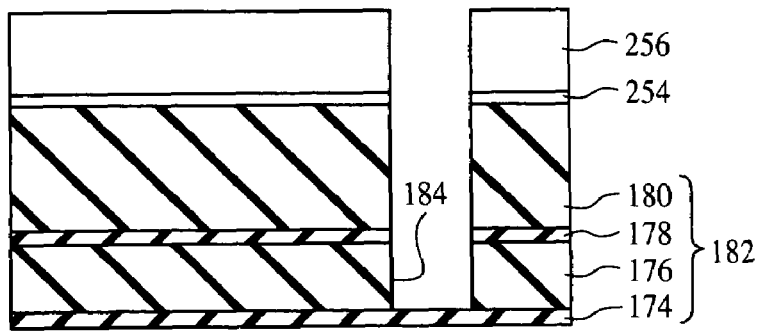

Then, a photoresist film 256 for exposing the region for the via hole 184 to be formed in the silicon oxide film 176 and the SiC film 174 is formed on the silicon nitride film 254 by photolithography (see FIG. 12B).

Then, with the photoresist film 256 as a mask, the silicon nitride film 254, the silicon oxide film 180, the SiC film 178 and the silicon oxide film 176 are sequentially etched under suitably changed conditions. Thus, the via hole 184 is formed in the silicon oxide film 176 (see FIG. 12C).

After the via hole 184 has been formed, the photoresist film 256 is removed.

Figure 12D:
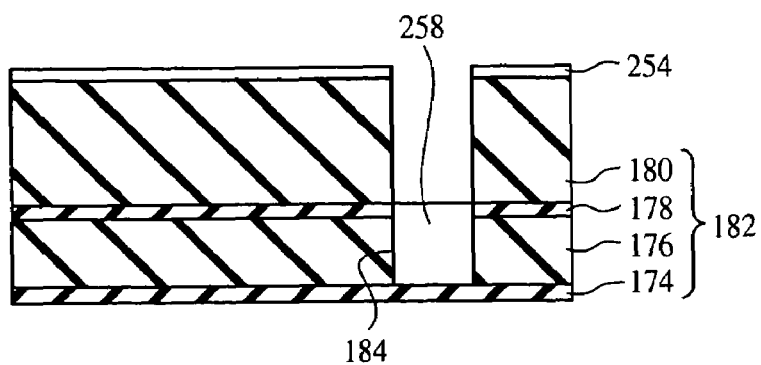

Next, after a resin 258 is buried in the via hole 184 by, e.g., spin coating, the resin 258 on the silicon nitride film 254 is removed by ashing using, e.g., O$_2$ plasma, and the resin 258 in the via hole 184 is etched back to a prescribed height until, for example, the upper surface of the resin 258 is positioned near the border between the SiC film 178 and the silicon oxide film 180 (see FIG. 12D).

Figure 13A:
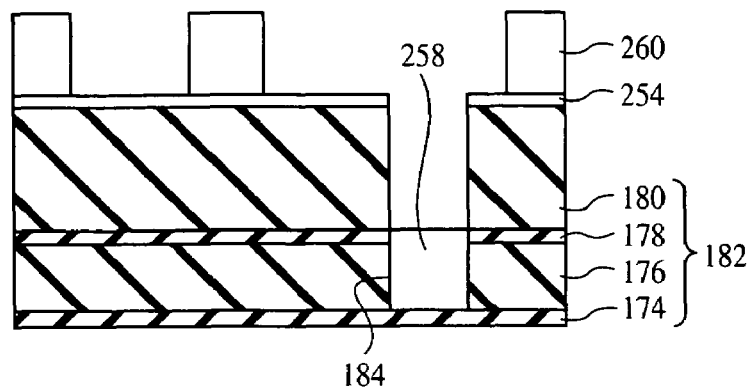
FIGS. 13A–13D are sectional views of the semiconductor device according to the embodiment of the present invention in the steps of the method for fabricating the semiconductor device, which show the method (Part 11).
Figure 13B:
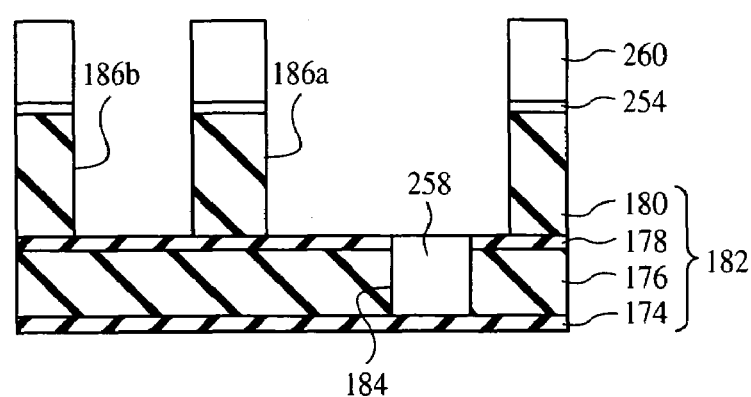
Figure 13C:
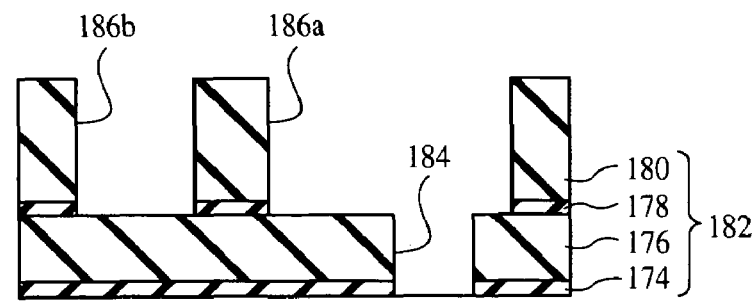

Then, a photoresist film 260 for exposing the region for the interconnection trenches 186a, 186b to be formed in the inter-layer insulation film 182 is formed on the silicon nitride film 254 by photolithography (see FIG. 13A). At this time, the photoresist film 260 is formed of a material which does not mix with the resin 258 and whose developer does not solve the resin 258.

Next, with the photoresist film 260 as a mask and with the SiC film 178 as a stopper, the silicon nitride film 254 and the silicon oxide film 180 are sequentially etched. Thus, the interconnection trenches 186a, 186b are formed in the silicon oxide film 180 (see FIG. 13B). The interconnection trenches 186a, 186b are formed in an interconnection pattern of a larger pitch than the interconnection patterns of the interconnection trenches of the lower interconnection part 12 and the intermediate interconnection part 14.

Then, the photoresist film 260 and the resin 258 in the via hole 184 are removed by ashing using, e.g., O$_2$ plasma and CF$_4$ plasma.

Next, under conditions which provide a sufficient selectivity with respect to silicon oxide film, the SiC film 178 at the bottoms of the interconnection trenches 186a, 186b and the SiC film 174 at the bottom of the via hole 184 are etched to open the interconnection trenches 186a, 186b down to the silicon oxide film 176 and open the via hole 184 down to the interconnection layer 172a. At this time, the silicon nitride film 154 on the silicon oxide film 180 is also etched off (see FIG. 13C).

Then, the barrier metal layer 188 of a Ta film of, e.g., 25 nm-thickness and a Cu film of, e.g., a 150 nm-thickness are continuously deposited on the entire surface by, e.g., sputtering. After the formation of the interconnection trenches 186a, 186b and the via hole 184 and before the deposition of the Ta films, pre-processing, such as Ar (argon) sputtering, H$_2$ plasma processing, H$_2$ annealing, etc., may be performed in-situ.

Figure 13D:
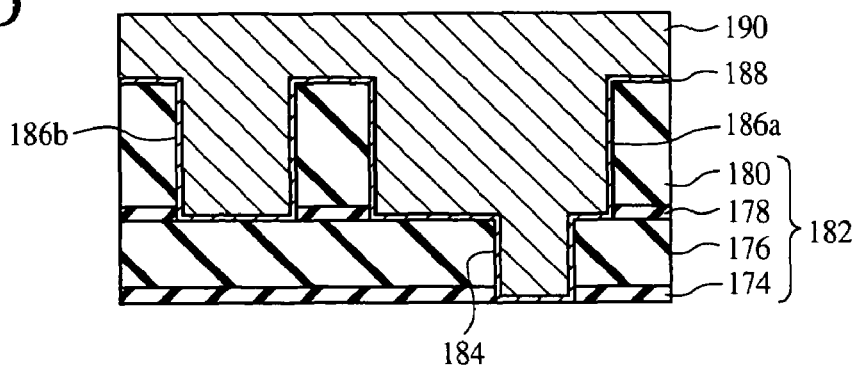

Next, with the Cu film formed on the barrier metal layer 188 as a seed, a Cu film is further deposited by electrolytic plating to form the Cu film 190 of, e.g., a 1.5 µm-total thickness (see FIG. 13D).

Figure 14A:
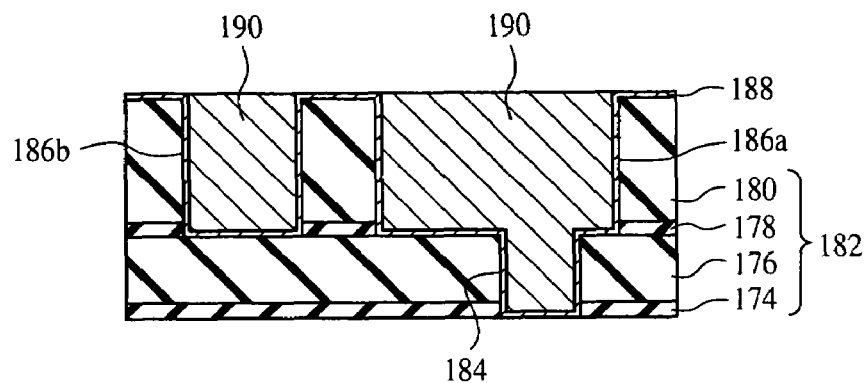
FIGS. 14A–14C are sectional views of the semiconductor device according to the embodiment of the present invention in the steps of the method for fabricating the semiconductor device, which show the method (Part 12).
Figure 14B:
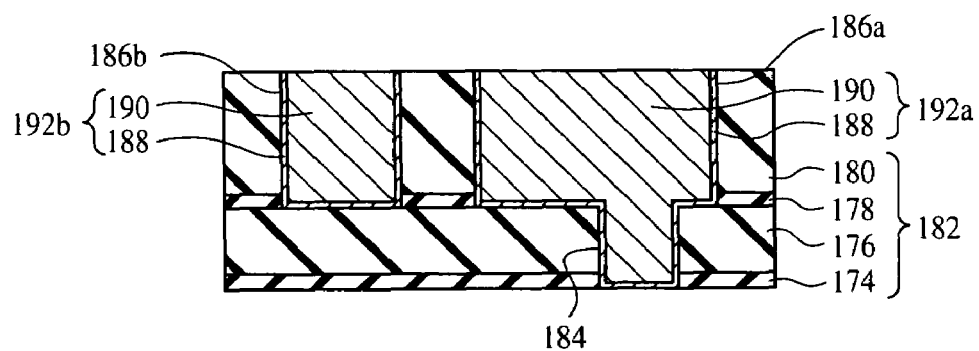

Then, the Cu film 190 and the barrier metal layer 188 of the Ta film are polished off flat by CMP (see FIGS. 14A and 14B). Thus are formed the interconnection layer 192a buried in the interconnection trench 186a and the via hole 184 and including the barrier metal layer 188 of the Ta film for preventing the Cu diffusion and the Cu film 190 forming the major part of the interconnection layer, and the interconnection layer 192b buried in the interconnection trench 186b and including the barrier metal layer 188 of the Ta film for preventing the Cu diffusion and the Cu film 190 forming the major part of the interconnection layer.

Figure 14C:
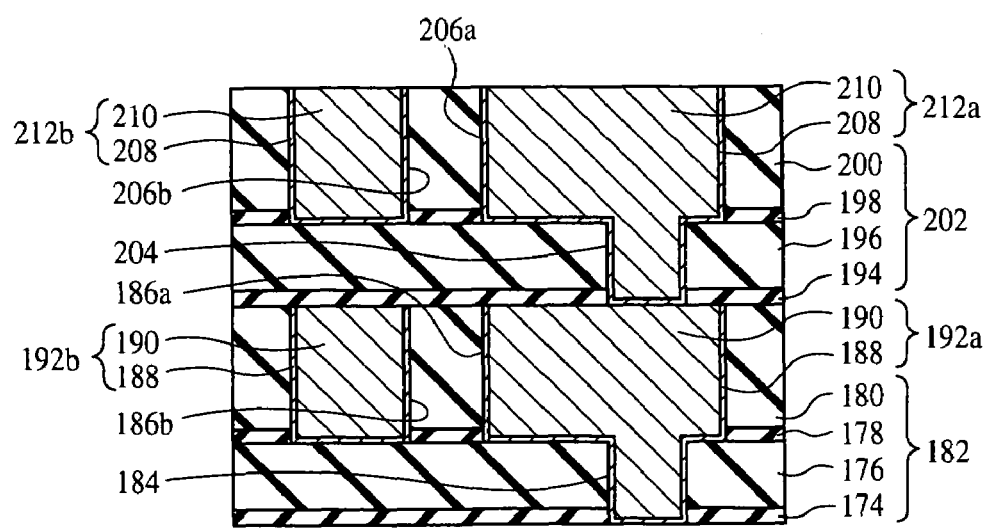

Then, the steps shown in FIGS. 12A to 14B are repeated to form the interconnection layer 212a, 212b buried in the interconnection layer 202 (see FIG. 14C).

Thus, the upper interconnection part 16 having the two-layer multilayer interconnection structure is formed on the intermediate interconnection part 14. The interconnection layer 192a, 192b and the interconnection layer 212a, 212b are formed in interconnection patterns of a larger pitch than the interconnection patterns of the interconnection layers of the lower interconnection part 12 and the intermediate interconnection part 14. For example, the interconnection layer 192a, 192b and the interconnection layer 212a, 212b are formed in the interconnection patterns of respectively, e.g., a 0.84 µm pitch.

Next, on the inter-layer insulation film 202 with the interconnection layer 212a, 212b buried in, the SiC film 214 of, e.g., a 70 nm-thickness is formed by, e.g., plasma CVD.

Then, the silicon oxide film 216 of, e.g., a 600 nm-thickness is formed on the SiC film 214 by, e.g., plasma CVD.

Figure 15A:
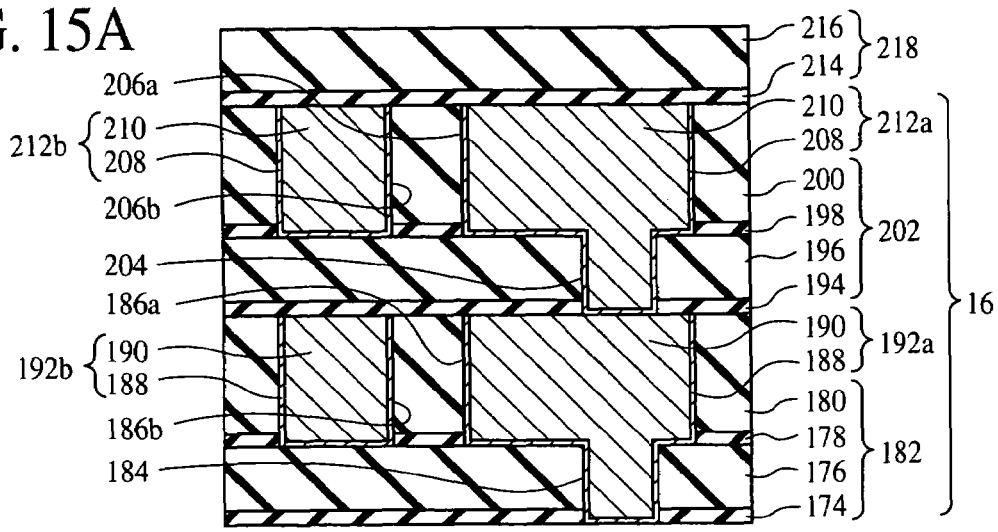
FIGS. 15A–15C are sectional views of the semiconductor device according to the embodiment of the present invention in the steps of the method for fabricating the semiconductor device, which show the method (Part 13).

Thus, the inter-layer insulation film 218 of the layer structure of the silicon oxide film 216/the SiC film 214 is formed (see FIG. 15A).

Then, the contact holes 220 are formed in the silicon oxide film 216 and the SiC film 214 down to the interconnection layer 212a of the upper interconnection part 16 by photolithography and dry etching.

Next, a TiN film of, e.g., a 50 nm-thickness and a W film of, e.g., a 300 nm-thickness are formed by, e.g., CVD.

Figure 15B:
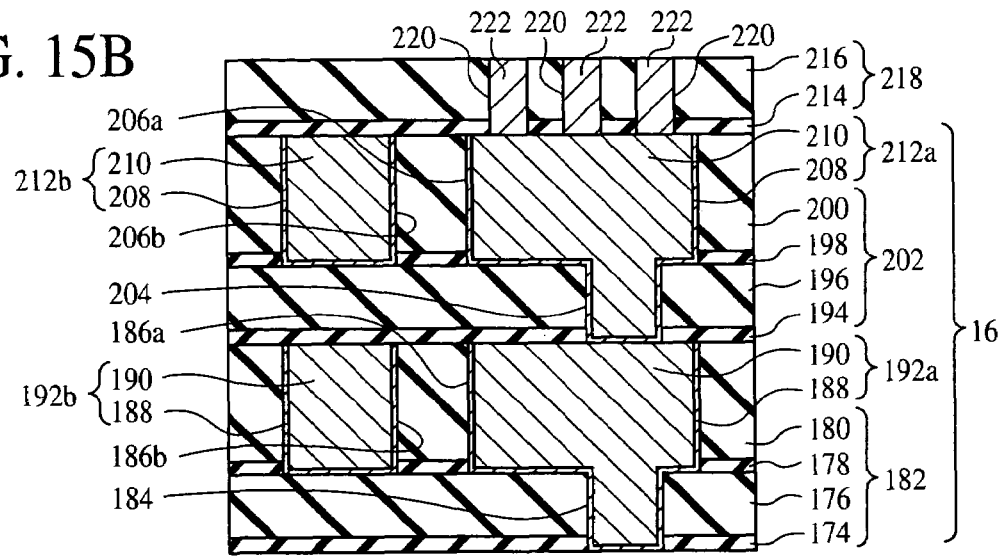
Figure 15C:
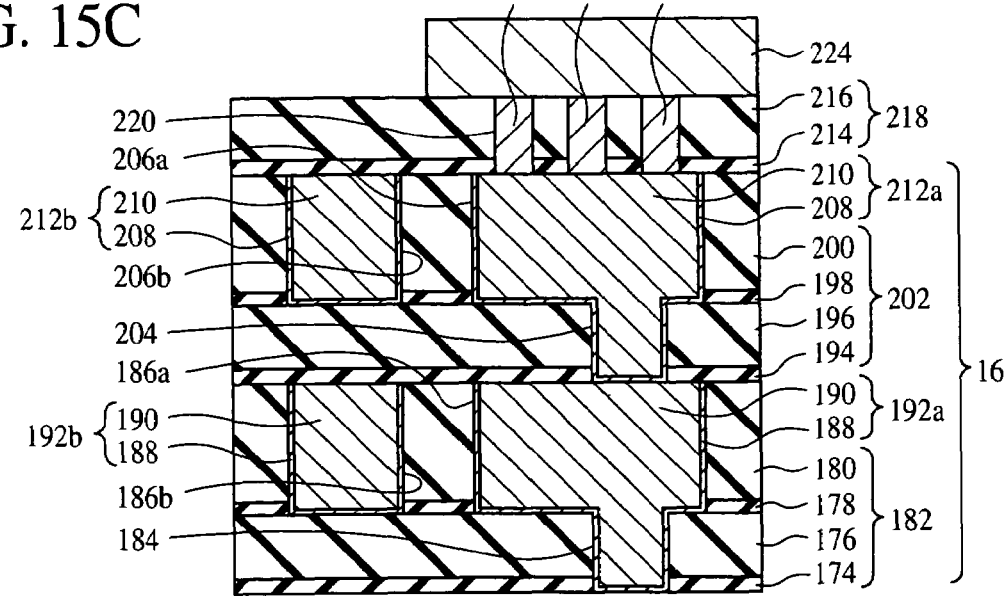

Then, the W film and the TiN film are removed flat by, e.g., CMP until the surface of the silicon oxide film 216 is exposed to form the contact plugs 222 of the TiN film and the W film are formed, buried in the contact holes 220 (see FIG. 15B).

Next, on the inter-layer insulation film 216 with the contact plugs 222 buried in, a metal film is formed by, e.g., CVD. The metal film may be formed of, e.g., a TiN film, an Al (aluminum) film and a TiN film laid sequentially. Next, the metal film is patterned to form the electrode 224 connected to the contact plugs 222 (see FIG. 15C).

Figure 16A:
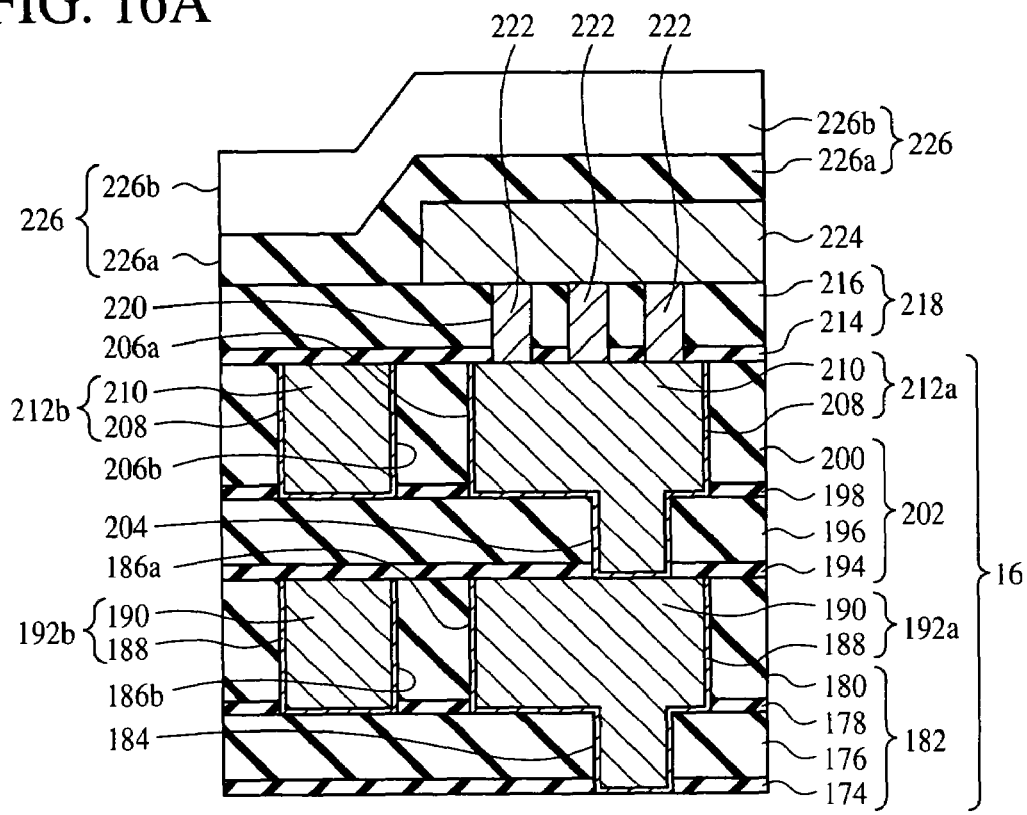
FIGS. 16A–16B are sectional views of the semiconductor device according to the embodiment of the present invention in the steps of the method for fabricating the semiconductor device, which show the method (Part 14)

Then, the silicon oxide film 226a of, e.g., a 1400 nm-thickness and the silicon nitride film 226b of, e.g., a 500 nm-thickness are sequentially formed by, e.g., CVD on the inter-layer insulation film 218 with the electrode 224 formed on to form the cover film 226 of the layer film of the silicon oxide film 226a and the silicon nitride film 226b (see FIG. 16A).

Figure 16B:
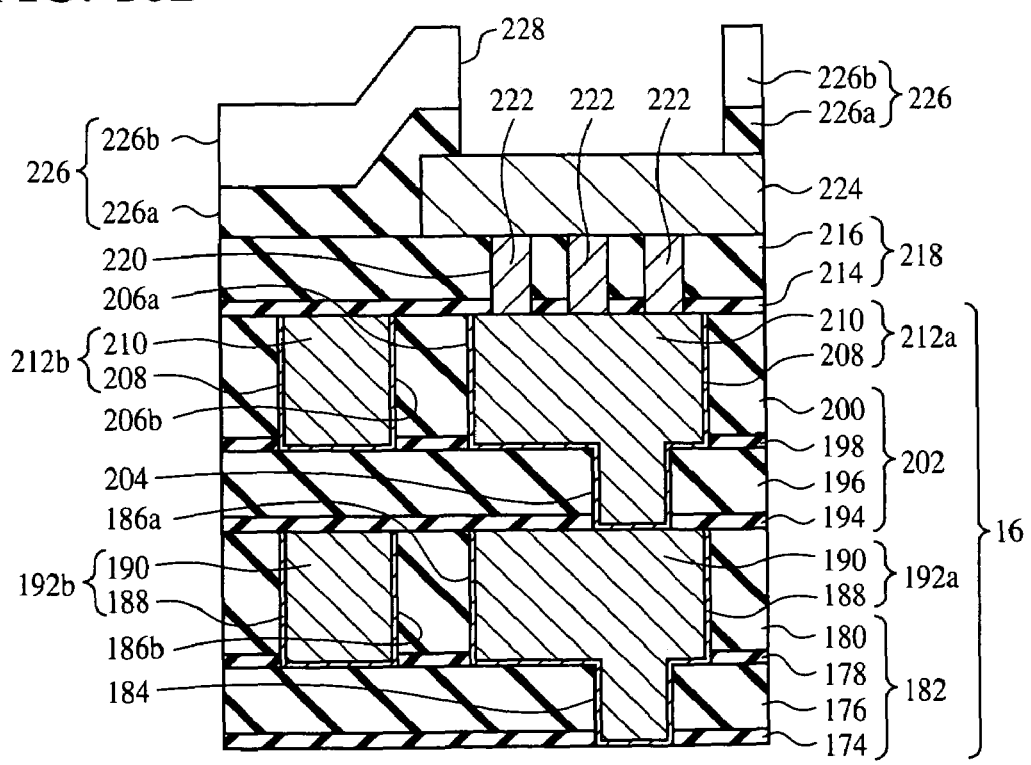
Figure 17:
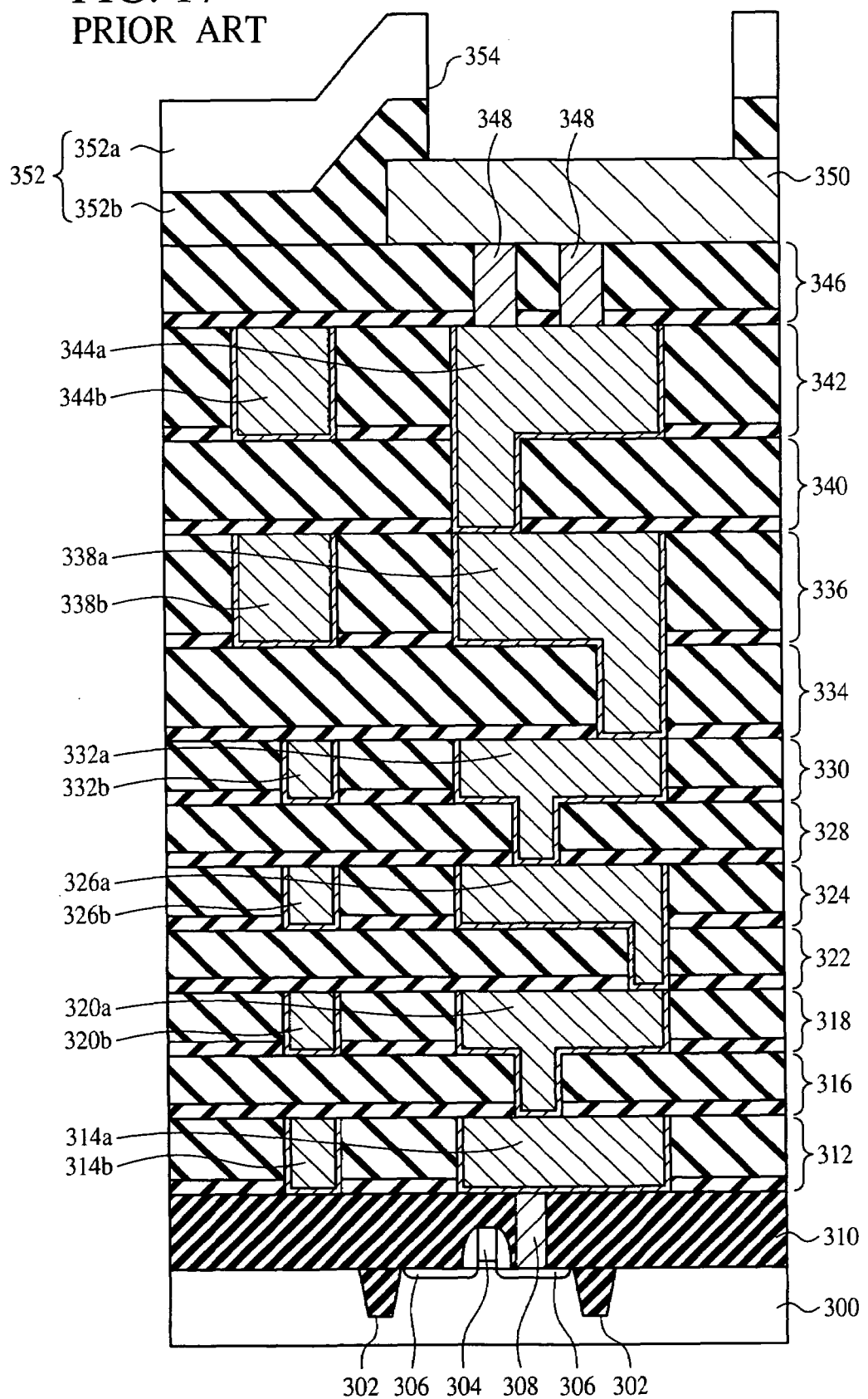
FIG. 17 is a sectional view of a semiconductor device having the conventional multilayer interconnection structure, which shows the structure thereof.

Next, the opening 228 is formed in the cover film 226 down to the electrode 224 by photolithography and dry etching (see FIG. 16B).

Thus, the semiconductor device shown in FIG. 1 is fabricated.

As described above, according to the present embodiment, the lower interconnection part 12 and the intermediate interconnection part 14 include low-k films as the inter-layer insulation films, and in the lower interconnection part 12, in which the interconnection layers have the interconnection patterns of a smaller pitch than the interconnection patterns of the interconnection layers of the intermediate interconnection part 14, the hydrophilic insulation film of silicon oxide film is formed on the low-k film, but in the intermediate interconnection part 14, in which the interconnection layers have the interconnection patterns of a larger pitch of the interconnection patterns of the interconnection layers of the lower interconnection part 12, the SiC film functioning as the diffusion preventing film is formed directly on the low-k film, without any hydrophilic insulation film formed, whereby, corresponding to the functions of the interconnection layers of the multilayer interconnection structure, the lower interconnection part 12, in which the interconnection layers are formed in the interconnection patterns of a smaller pitch than the interconnection pattern of the interconnection layers of the intermediate interconnection part 14, can suppress the occurrence of defects due to the foreign matter adhesion and can decrease the interconnection capacitance, while the intermediate interconnection part 14, in which the interconnection layers are formed in the interconnection patterns of a larger pitch than the interconnection patterns of the interconnection layers of the lower interconnection part 12, can sufficiently decrease the interconnection capacitance.

MODIFIED EMBODIMENTS

The present invention is not limited to the above-described embodiment and can cover other various modifications.

For example, in the above-described embodiment, SiOC film is used as the low-k film. However, the low-k film is not limited to SiOC film and can be any film of flow-k material. As the low-k film, the film of SiLK (registered trademark) by The Dow Chemical Company, FLARE (registered trademark) by Honeywell Electronic Materials, or BCB (benzo-cyclobutene), etc., for example, other than SiOC can be used. Porous silicon oxide film having fine pores therein can be also used as the low-k film.

In the above-described embodiment, as the hydrophilic insulation film formed on the low-k film, silicon oxide film is used. However, the hydrophilic insulation film is not limited to silicon oxide film and can be, e.g., FSG film other than silicon oxide film.

In the above-described embodiment, SiC film is used as the film functioning as the etching stopper film and the Cu diffusion preventing film. However, the film functioning as the etching stopper film and the Cu diffusion preventing film is not limited to SiC film. As the film functioning as the etching stopper film and the Cu diffusion preventing film, silicon nitride film, for example, other than SiC film can be used other.

In the above-described embodiment, the interconnection layers are formed by filling the barrier metal layer of Ta film and the Cu film in the via holes and the interconnection trenches. However, the interconnection layers can be formed by burying various conductor films other than Ta film and Cu film. Major materials of the interconnection layers can be various conductors, such as Al, etc., other than Cu. The barrier metal layer for preventing the diffusion of metal can be formed of, e.g., TaN (tantalum nitride) film, Ti (titanium) film, TiN (titanium nitride) film, etc. other than Ta film.

In the above-described embodiment, five interconnection layers are formed in the lower interconnection part 12, two interconnection layers are formed in the intermediate interconnection part 14, and two interconnection layers are formed in the upper interconnection part 16. However, numbers of the layers of the respective interconnection parts can be suitably designed as required.

In the above-described embodiment, Ta film and Cu film are concurrently buried in the via holes and the interconnection trenches by dual damascene process. However, it is possible to form the via hole and the interconnection trenches independently by single damascene process, and Ta film and Cu film are buried independently therein. In this case, in the lower interconnection part 12, the inter-layer insulation film of the low-k film and the hydrophilic insulation film formed on the low-k film is formed, and the via hole is formed in the inter-layer insulation film. Then, in the same way as the interconnection layer 44a, 44b are buried in the interconnection trenches 38a, 38b of the first layer in the above-described embodiment, the conductor film is buried in the via hole. The hydrophilic insulation film is exposed on the surface after the conductor film has been buried in the via hole, which allows the lift-off of the foreign matter to be sufficiently performed by HF processing, and the generation of water marks, which are causes for corrosion can be suppressed.

In the above-described embodiment, the conductor film is buried in the interconnection trenches and the via holes interconnecting the interconnection layers. However, the present invention is applicable to burying a conductor film in various openings, as of dummy patterns, etc.

In the above-described embodiment, in the lower interconnection part 12, the intermediate interconnection part 14 and the upper interconnection part 16, the interconnection patterns of the interconnection layers of the same interconnection part are in the same pitch. However, the pitches of the interconnection patterns of the interconnection layers of the same interconnection part can be varied suitably as required as long as a minimum pitch of the interconnection patterns of the interconnection layers of the intermediate interconnection part 14 is larger than a minimum pitch of the interconnection patterns of the interconnection layers of the lower interconnection part 12. A minimum pitch of the interconnection patterns of the interconnection layers of the upper interconnection part 16 may be larger than the minimum pitch of the interconnection patterns of the interconnection layer of the lower interconnection part 12 and the intermediate interconnection part 14.

What is claimed is:

1. A semiconductor device comprising:
   a first inter-layer insulation film formed over a substrate and including a first low dielectric constant film whose dielectric constant is lower than that of silicon oxide and a hydrophilic insulation film formed on the first low dielectric constant film;
   a first interconnection layer buried in a first interconnection trench formed in the first inter-layer insulation film, whose minimum interconnection pitch is a first pitch;
   a second inter-layer insulation film formed over the first inter-layer insulation film and including a second low dielectric constant film whose dielectric constant is lower than that of silicon oxide;
   a second interconnection layer buried in a second interconnection trench formed in the second inter-layer insulation film, whose minimum interconnection pitch is a second pitch larger than the first pitch; and
   a diffusion preventing film formed directly on upper surfaces of the second low dielectric constant film and the second interconnection layer, without any hydrophilic insulation film between the second low dielectric constant film and the diffusion preventing film.

2. A semiconductor device according to claim 1, further comprising:
   a third inter-layer insulation film formed over the second inter-layer insulation film and including an insulation film having a dielectric constant higher than the first low dielectric constant film and the second low dielectric constant film; and
   a third interconnection layer buried in a third interconnection trench formed in the third inter-layer insulation film, whose minimum interconnection pitch is a third pitch larger than the first pitch and the second pitch.

3. A semiconductor device according to claim 2, further comprising
   a diffusion preventing film formed directly on the hydrophilic insulation film and the first interconnection layer.

4. A semiconductor device according to claim 2, wherein the second pitch is 1.5 or more times the first pitch.

5. A semiconductor device according to claim 1, further comprising a diffusion preventing film formed directly on the hydrophilic insulation film and the first interconnection layer.

6. A semiconductor device according to claim 1, wherein the second pitch is 1.5 or more times the first pitch.

7. A semiconductor device according to claim 1, wherein the low dielectric constant film is an SiOC film, a SiLK film, a BCB film, a FLARE film or a porous silicon oxide film.

8. A semiconductor device according to claim 1, wherein the interconnection layer is buried in a via hole formed in the inter-layer insulation film and in the interconnection trench formed in a region of the inter-layer insulation film, which includes the via hole.

9. A semiconductor device according to claim 1, wherein a main material of the interconnection layer is Cu or Al.

10. A semiconductor device comprising:
    a first multilayer interconnection layer formed over a substrate and including a plurality of interconnection layers whose minimum interconnection pitch is a first pitch, at least one of said plurality of the interconnection layers being buried in an opening formed in a first inter-layer insulation film including a first low dielectric constant film whose dielectric constant is lower than that of silicon oxide and a hydrophilic insulation film formed on the first low dielectric constant film; and
    a second multilayer interconnection layer formed over the first multilayer interconnection layer and including a plurality of interconnection layers whose minimum interconnection pitch is a second pitch larger than the first pitch, said plurality of the interconnection layers being buried in openings formed in a plurality of second inter-layer insulation films each including a diffusion preventing film and a second low dielectric constant film whose dielectric constant is lower than that of silicon oxide, the second low dielectric constant film being formed on the diffusion preventing film, the respective openings being formed in the respective second inter-layer insulation films, the respective interconnection layers being buried in the respective openings, and
    the diffusion preventing film of one second inter-layer insulation film being formed directly on an upper surface of the second low dielectric constant film of another second inter-layer insulation film underlying said one second inter-layer insulation film and an upper surface of the interconnection layer buried in said another second inter-layer insulation film, without any hydrophilic insulation film between the second low dielectric constant film of said another second inter-layer insulation film and the diffusion preventing film of said one second inter-layer insulation film.

11. A semiconductor device according to claim 10, further comprising
    a third multilayer interconnection layer formed over the second multilayer interconnection layer and including a plurality of interconnection layers whose minimum interconnection pitch is a third pitch larger than the first pitch and the second pitch,
    the plurality of interconnection layers forming the third multilayer interconnection layer being buried in an opening formed in a third inter-layer insulation film including an insulation film of a higher dielectric constant than the first low dielectric constant film and the second low dielectric constant film.

12. A semiconductor device comprising:
    a first inter-layer insulation film formed over a substrate and including a first low dielectric constant film whose dielectric constant is lower than that of silicon oxide and a hydrophilic insulation film formed on the first low dielectric constant film;

a first interconnection layer buried in a first interconnection trench formed in the first inter-layer insulation film, whose interconnection pitch is a first pitch;

a second inter-layer insulation film formed over the first inter-layer insulation film and including a second low dielectric constant film whose dielectric constant is lower than that of silicon oxide;

a second interconnection layer buried in a second interconnection trench formed in the second inter-layer insulation film, whose interconnection pitch is a second pitch larger than the first pitch; and a diffusion preventing film formed directly on upper surfaces of the second low dielectric constant film and the second interconnection layer, without any hydrophilic insulation film between the second low dielectric constant film and the diffusion preventing film.

13. A semiconductor device according to claim 12, further comprising:

a third inter-layer insulation film formed over the second inter-layer insulation film and including an insulation film having a dielectric constant higher than the first low dielectric constant film and the second low dielectric constant film; and a third interconnection layer buried in a third interconnection trench formed in the third inter-layer insulation film, whose interconnection pitch is a third pitch larger than the first pitch and the second pitch.

14. A semiconductor device comprising:

a first multilayer interconnection layer formed over a substrate and including a plurality of interconnection layers whose interconnection pitch is a first pitch, at least one of said plurality of the interconnection layers being buried in an opening formed in a first inter-layer insulation film including a first low dielectric constant film whose dielectric constant is lower than that of silicon oxide and a hydrophilic insulation film formed on the first low dielectric constant film; and a second multilayer interconnection layer formed over the first multilayer interconnection layer and including a plurality of interconnection layers whose interconnection pitch is a second pitch larger than the first pitch, said plurality of the interconnection layers being buried in openings formed in a plurality of second inter-layer insulation films each including a diffusion preventing film and a second low dielectric constant film whose dielectric constant is lower than that of silicon oxide, the second low dielectric constant film being formed on the diffusion preventing film, the respective openings being formed in the respective second inter-layer insulation films, the respective interconnection layers being buried in the respective openings, and the diffusion preventing film of one second inter-layer insulation film being formed directly on an upper surface of the second low dielectric constant film of another second inter-layer insulation film underlying said one second inter-layer insulation film and an upper surface of the interconnection layer buried in said another second inter-layer insulation film, without any hydrophilic insulation film between the second low dielectric constant film of said another second inter-layer insulation film and the diffusion preventing film of said one second inter-layer insulation film.

15. A semiconductor device according to claim 14, further comprising a third multilayer interconnection layer formed over the second multilayer interconnection layer and including a plurality of interconnection layers whose interconnection pitch is a third pitch layer than the first pitch and the second pitch, the plurality of interconnection layers forming the third multilayer interconnection layer being buried in an opening formed in a third inter-layer insulation film including an insulation film of a higher dielectric constant than the first low dielectric constant film and the second low dielectric constant film.

* * * * *